United States Patent
Ahn

(10) Patent No.: US 8,017,462 B2
(45) Date of Patent: *Sep. 13, 2011

(54) METHOD OF MAKING A LIQUID CRYSTAL DISPLAY DEVICE CAPABLE OF INCREASING CAPACITANCE OF STORAGE CAPACITOR

(75) Inventor: Byung Chul Ahn, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 97 days.

This patent is subject to a terminal disclaimer.

(21) Appl. No.: 12/292,950

(22) Filed: Dec. 1, 2008

(65) Prior Publication Data

US 2009/0085040 A1    Apr. 2, 2009

Related U.S. Application Data

(62) Division of application No. 11/137,411, filed on May 26, 2005, now Pat. No. 7,468,527.

(30) Foreign Application Priority Data

May 27, 2004    (KR) .................. 10-2004-0037771

(51) Int. Cl.
*H01L 21/00* (2006.01)
*H01L 21/84* (2006.01)

(52) U.S. Cl. ..................................... 438/158
(58) Field of Classification Search .............. 438/158
See application file for complete search history.

(56) References Cited

U.S. PATENT DOCUMENTS

| | | |
|---|---|---|
| 4,736,229 A | 4/1988 | Holmberg et al. |
| 4,778,560 A | 10/1988 | Takeda et al. |
| 5,032,531 A | 7/1991 | Tsutsui et al. |
| 5,162,933 A | 11/1992 | Kakuda et al. |
| 5,339,181 A | 8/1994 | Kim et al. |
| 5,462,887 A | 10/1995 | Glück |
| 5,668,379 A | 9/1997 | Ono et al. |
| 5,731,856 A | 3/1998 | Kim et al. |
| 5,771,083 A | 6/1998 | Fujihara et al. |
| 5,793,460 A | 8/1998 | Yang |
| 5,847,781 A | 12/1998 | Ono et al. |
| 5,976,902 A | 11/1999 | Shih |
| 6,335,276 B1 | 1/2002 | Park et al. |
| 6,338,989 B1 * | 1/2002 | Ahn et al. ............. 438/158 |
| 6,485,997 B2 * | 11/2002 | Lee et al. ............. 438/30 |
| 6,524,876 B1 | 2/2003 | Baek et al. |
| 6,549,251 B2 | 4/2003 | Kim |

(Continued)

FOREIGN PATENT DOCUMENTS

CN    1499271    5/2004

*Primary Examiner* — Howard Weiss
(74) *Attorney, Agent, or Firm* — McKenna Long & Aldridge LLP

(57) ABSTRACT

A thin film transistor substrate and a fabricating method simplify a process and enlarge a capacitance value of a storage capacitor without any reduction of aperture ratio. A transparent first conductive layer and an opaque second conductive layer of a double-layer structured gate line are formed having a step coverage. A pixel electrode is provided on the gate insulating film within a pixel hole of said pixel area passing through the passivation film to be connected to the thin film transistor. A storage capacitor overlaps with the pixel electrode with having the gate insulating film therebetween and has a lower storage electrode protruded from the first conductive layer.

20 Claims, 31 Drawing Sheets

U.S. PATENT DOCUMENTS

| | | |
|---|---|---|
| 6,590,226 B2 | 7/2003 | Kong et al. |
| 6,696,324 B2 | 2/2004 | Hong et al. |
| 6,710,372 B2 | 3/2004 | Kim |
| 6,777,709 B2 | 8/2004 | Wu et al. |
| 6,787,809 B2 | 9/2004 | Hong et al. |
| 6,882,375 B2 | 4/2005 | Kim |
| 6,885,030 B2 | 4/2005 | Onozuka et al. |
| 6,939,750 B2 | 9/2005 | Hotta et al. |
| 7,045,373 B2 | 5/2006 | Shih |
| 7,138,655 B2 | 11/2006 | Tak et al. |
| 7,351,623 B2 * | 4/2008 | Ahn .............................. 438/158 |
| 2003/0007108 A1 | 1/2003 | Hwang et al. |

* cited by examiner

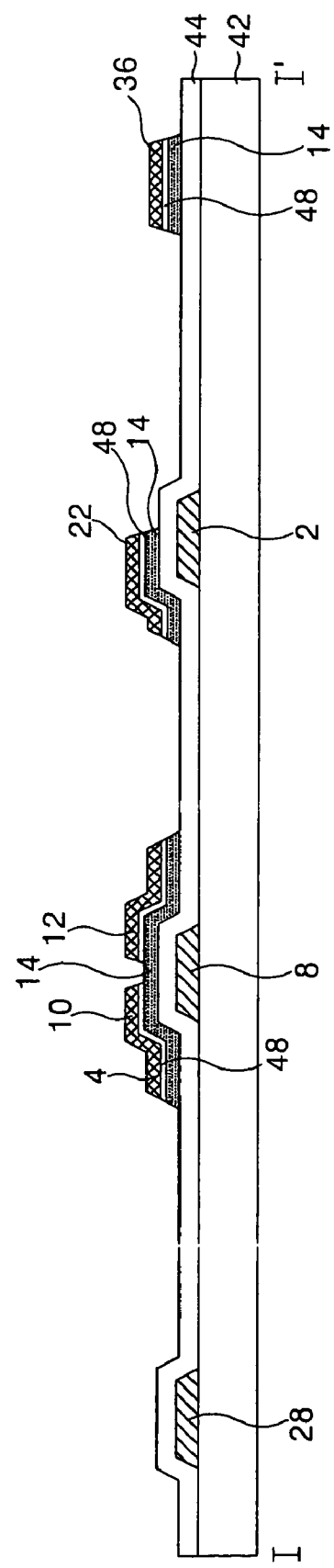

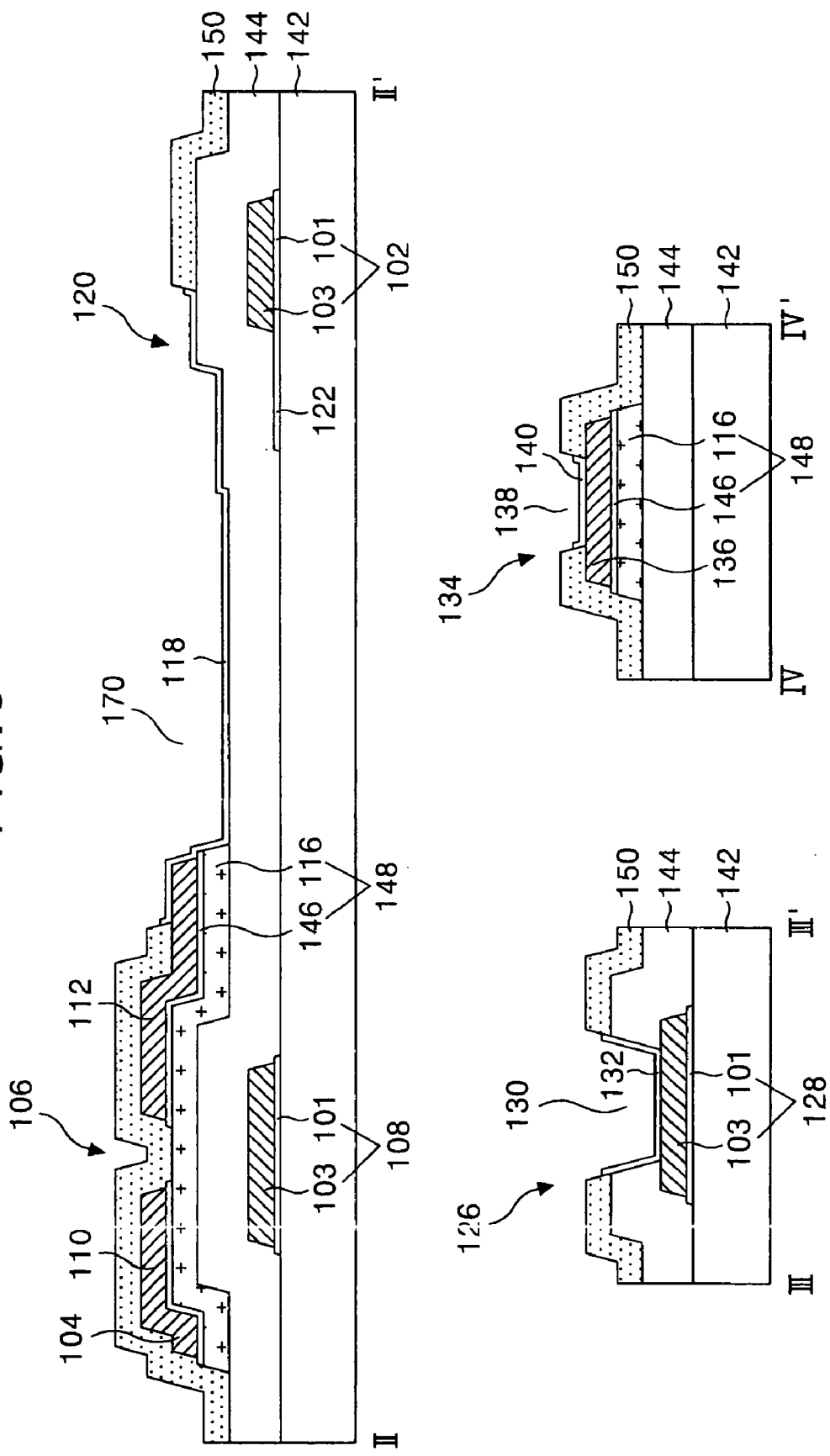

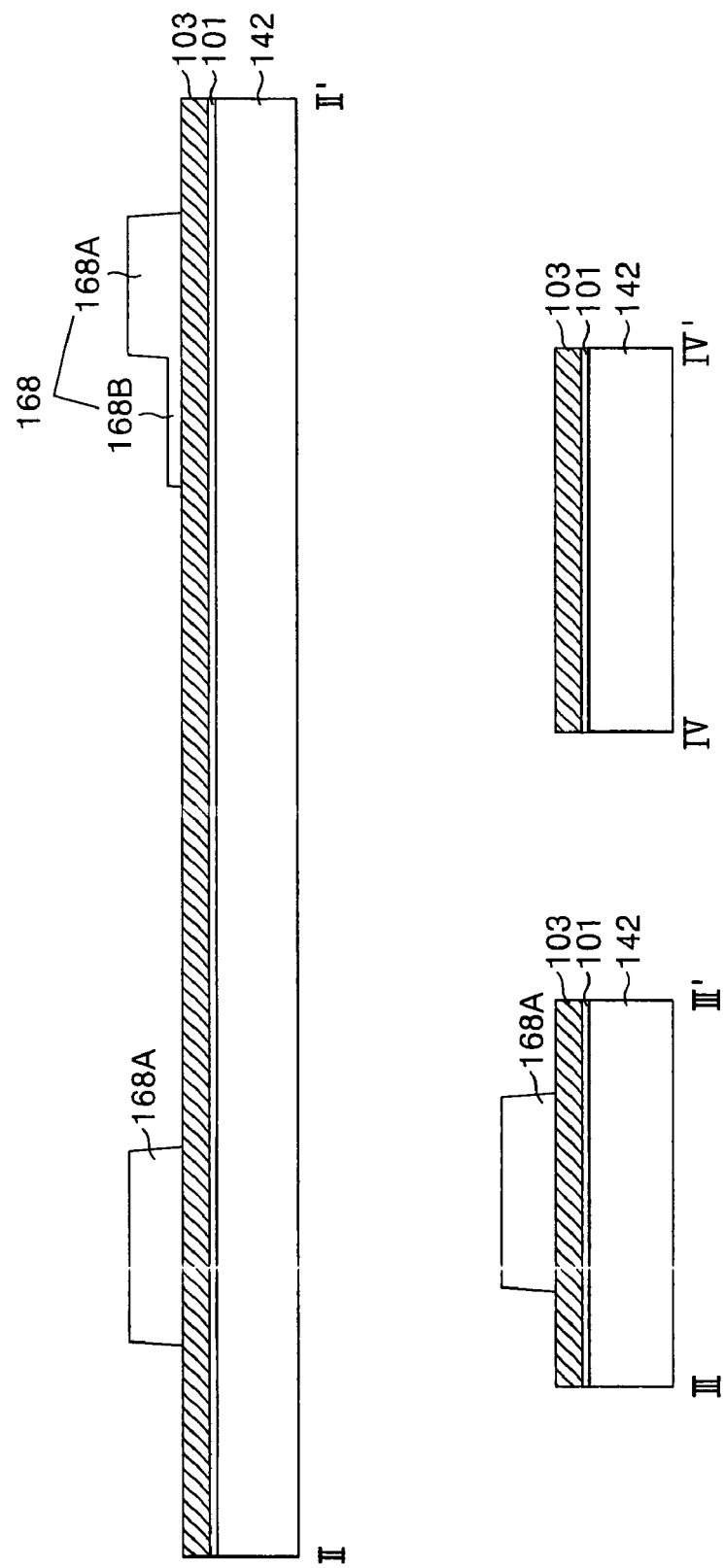

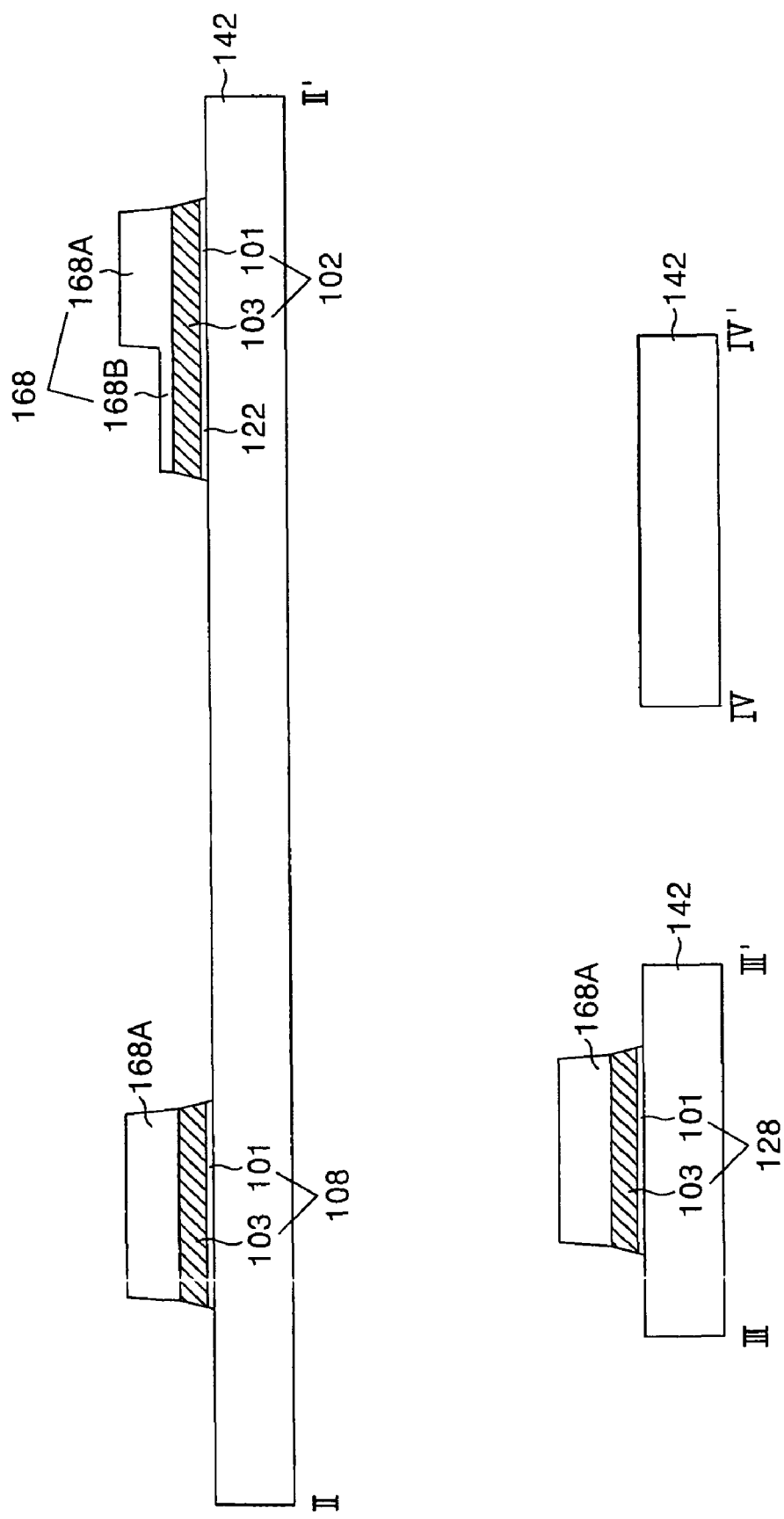

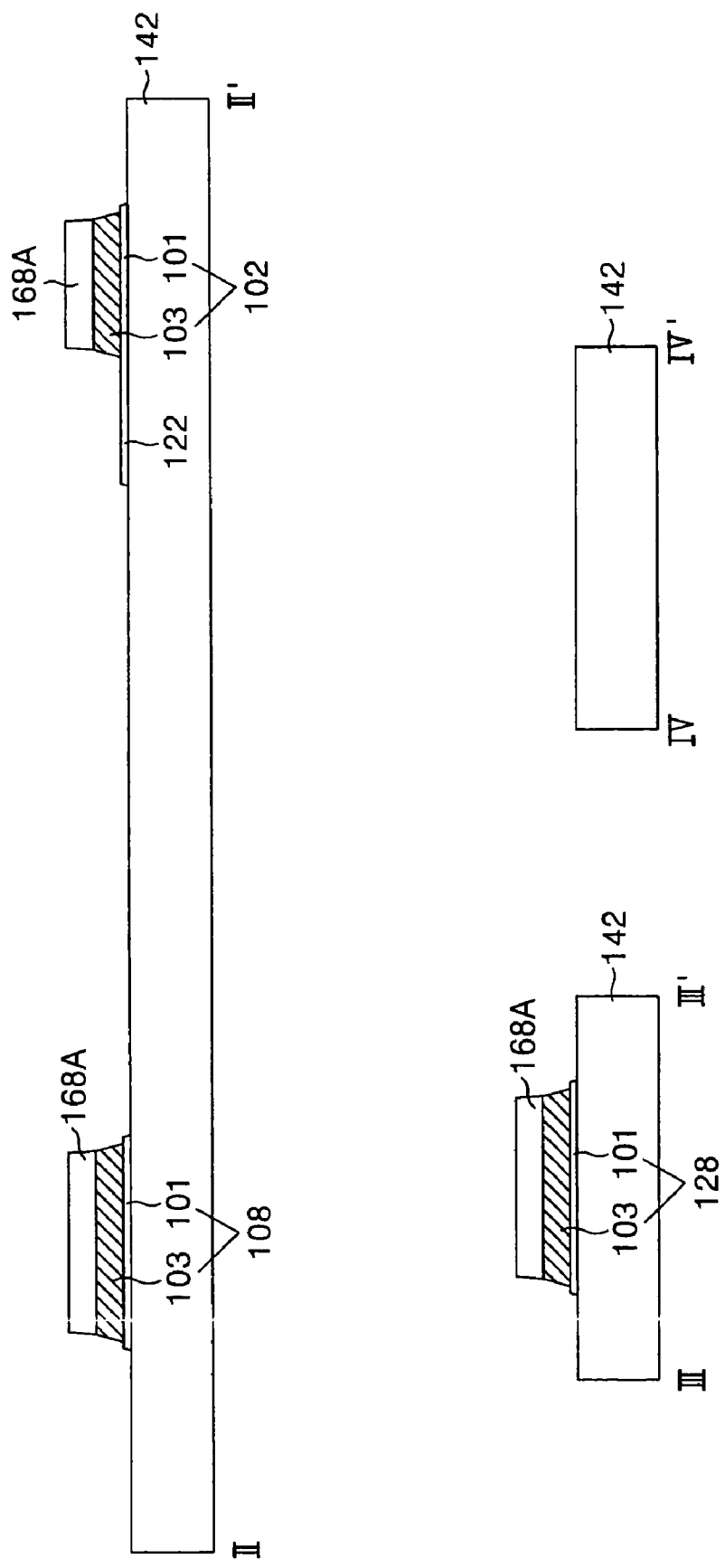

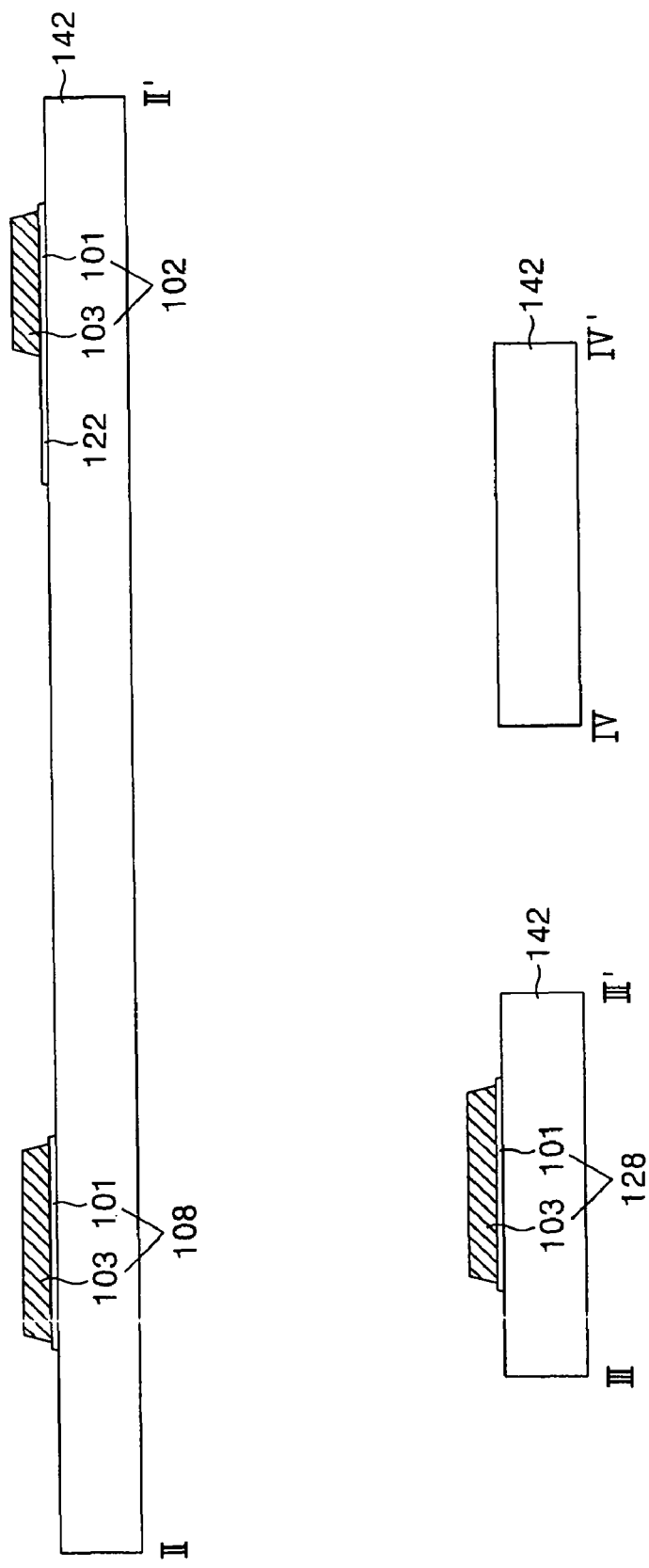

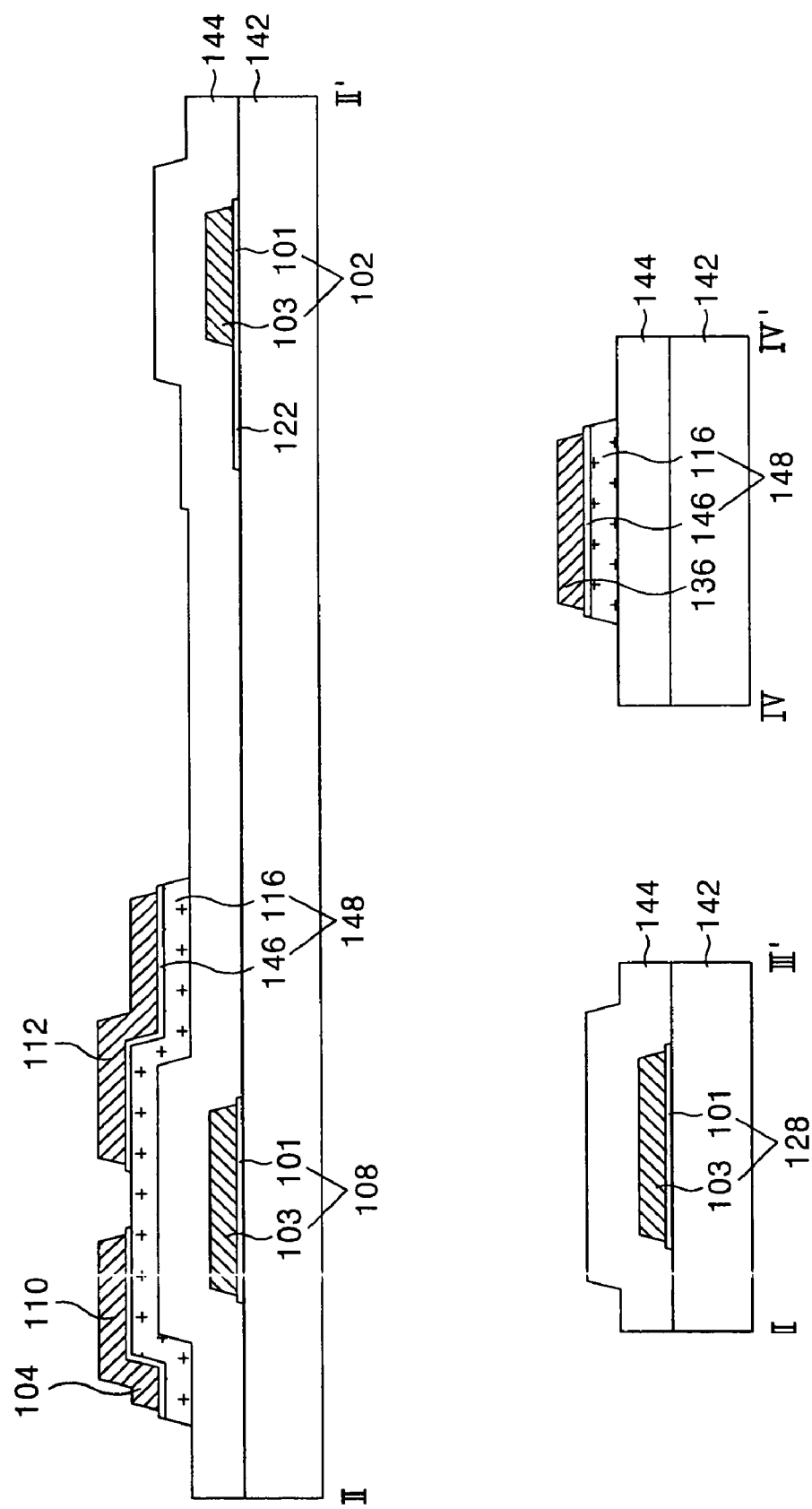

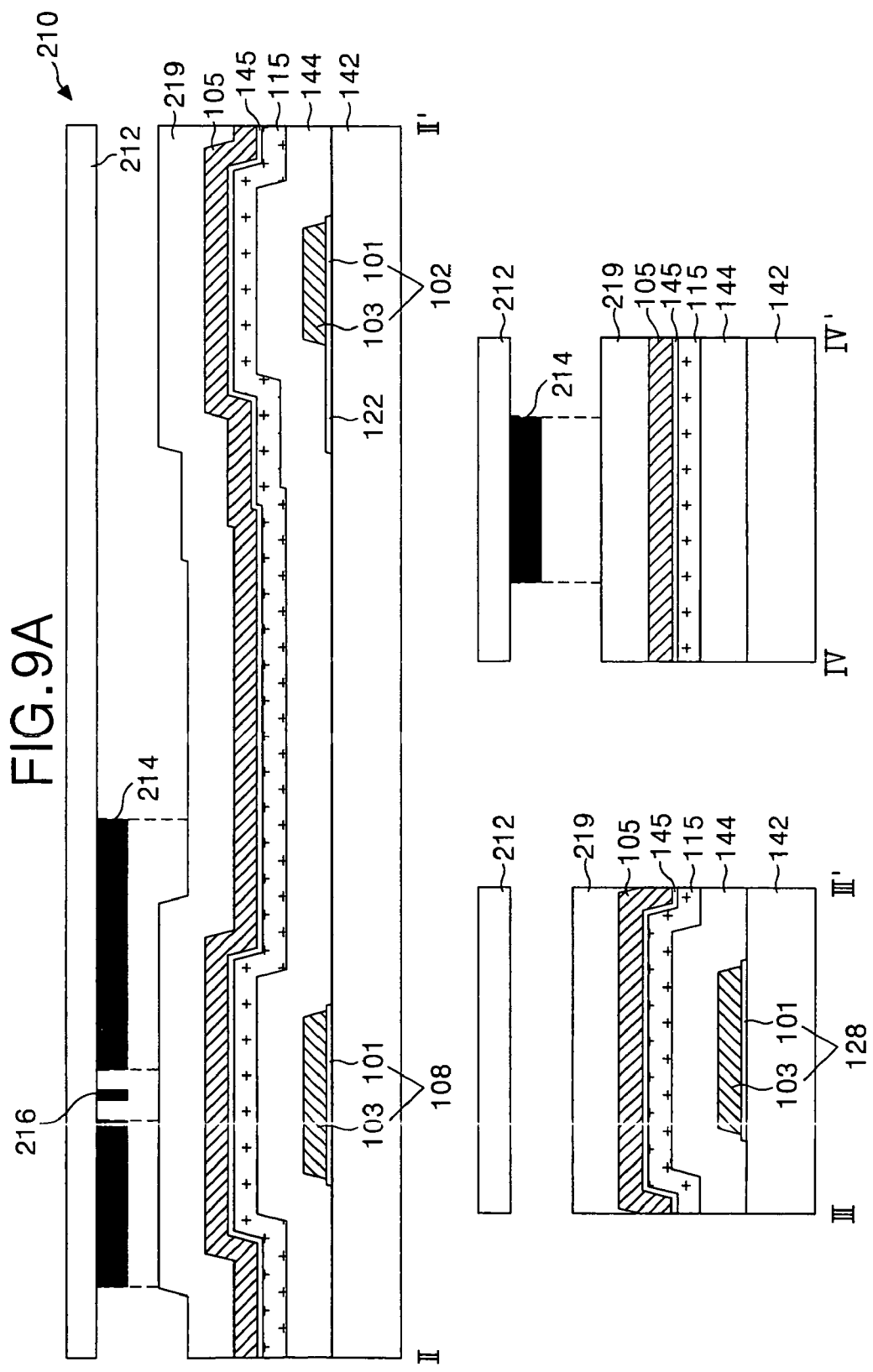

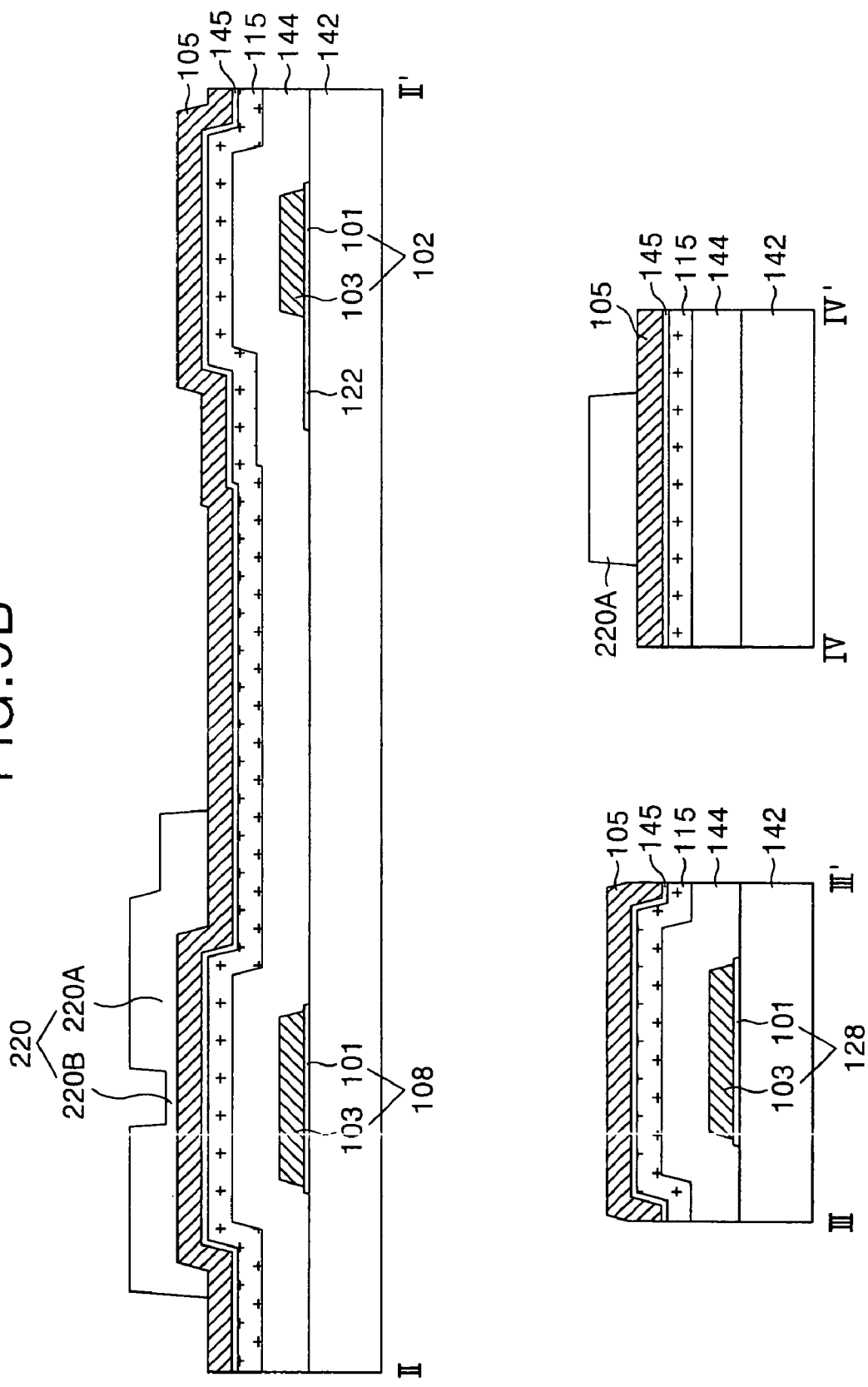

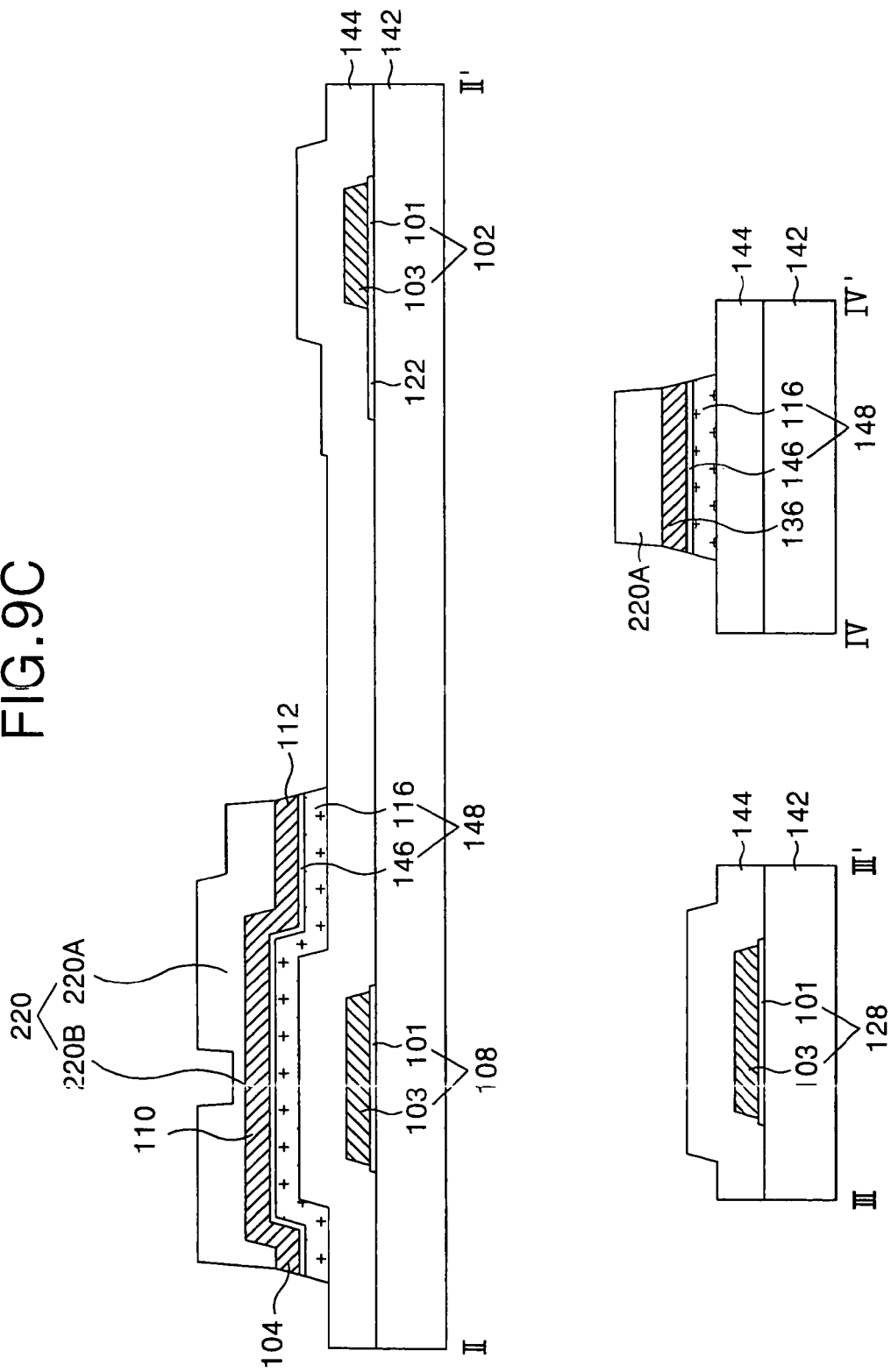

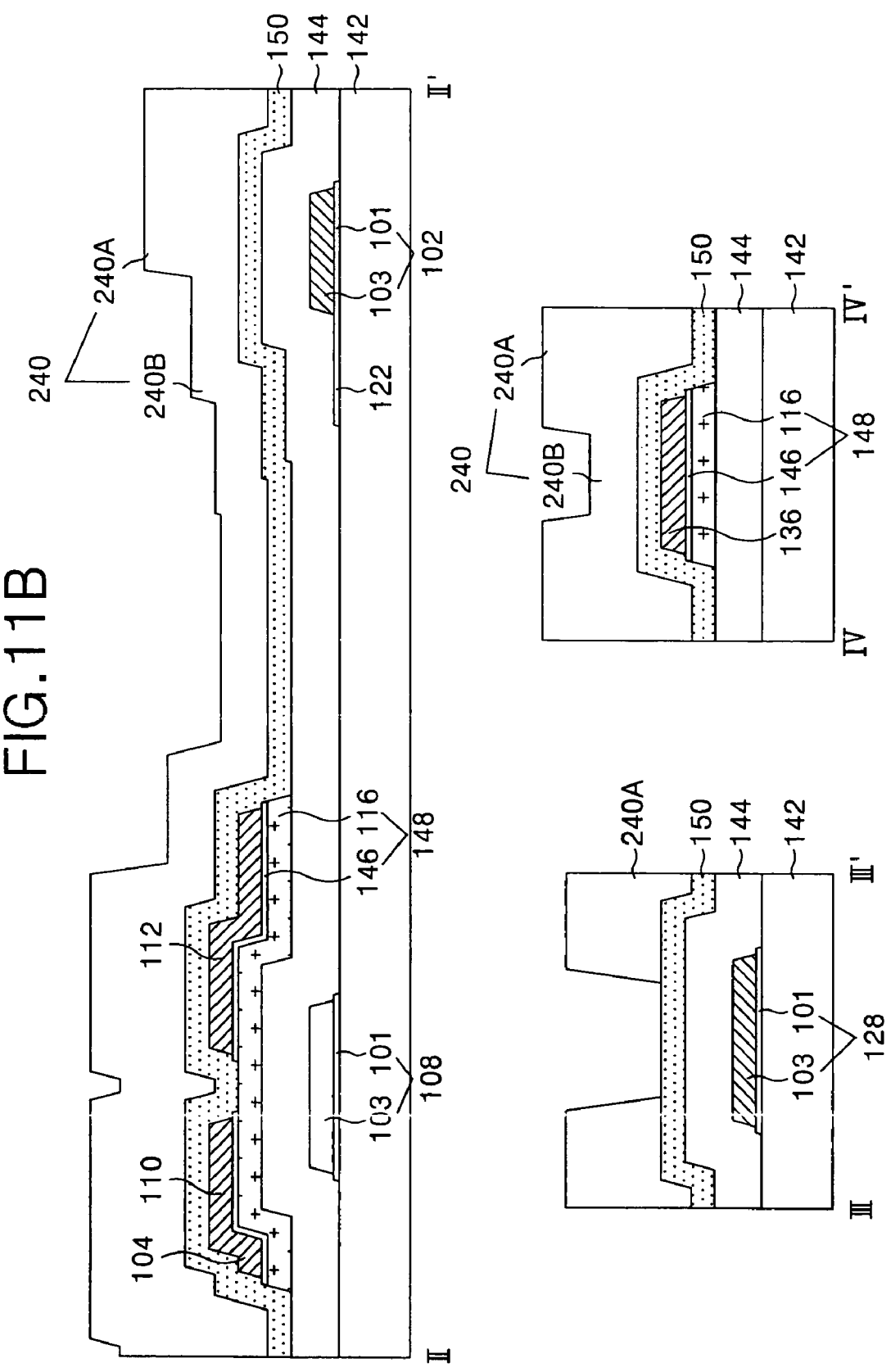

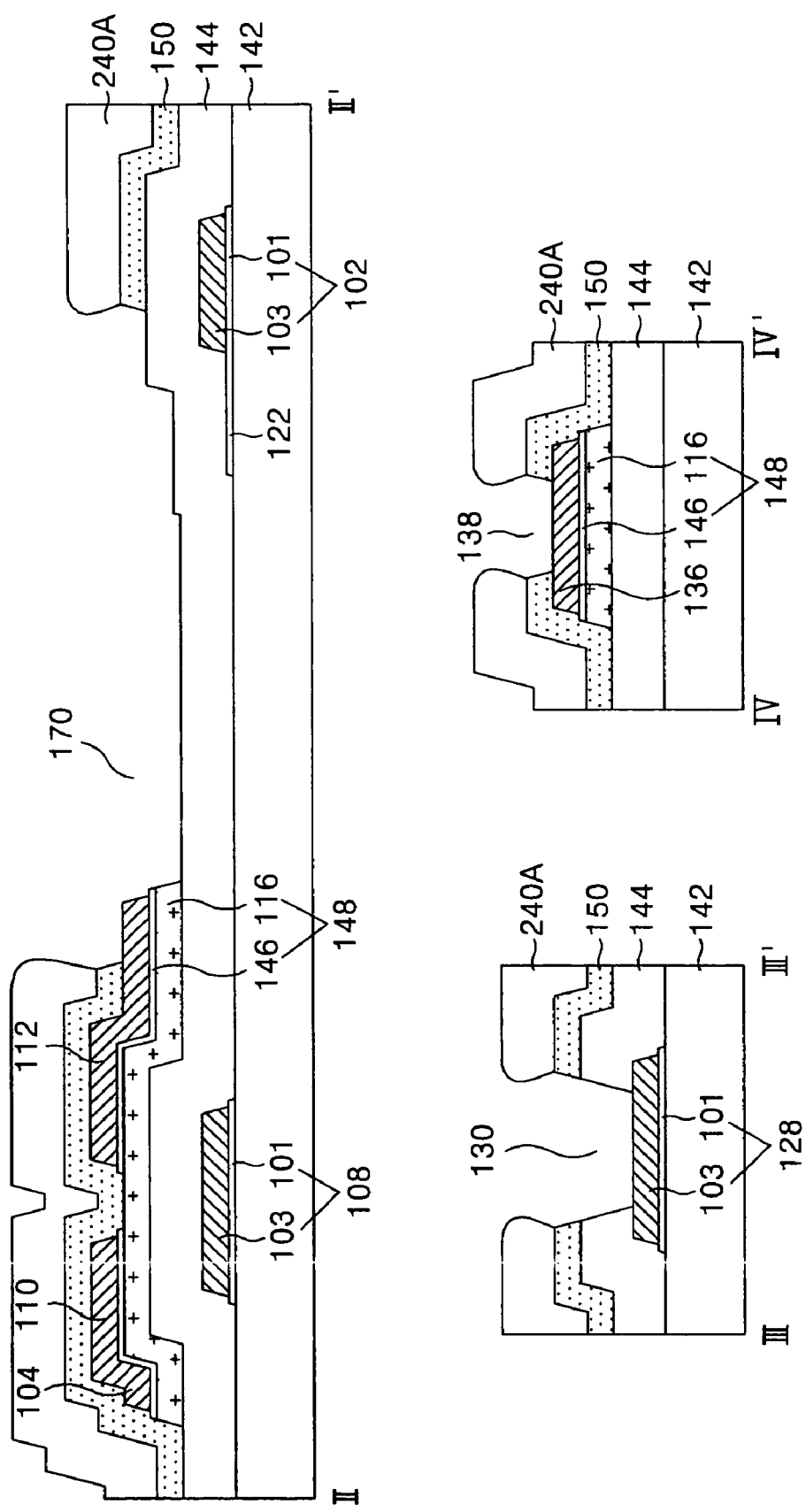

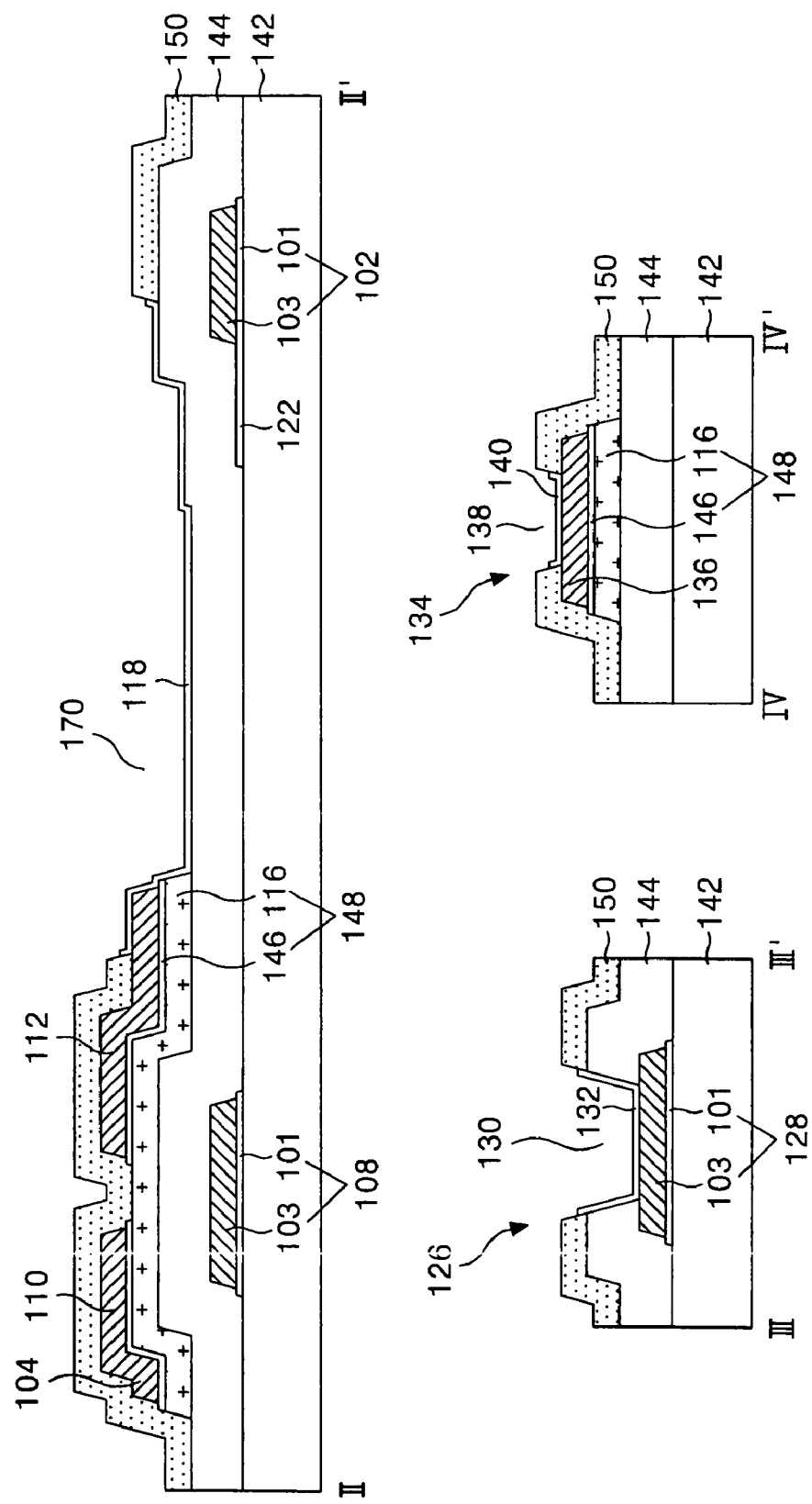

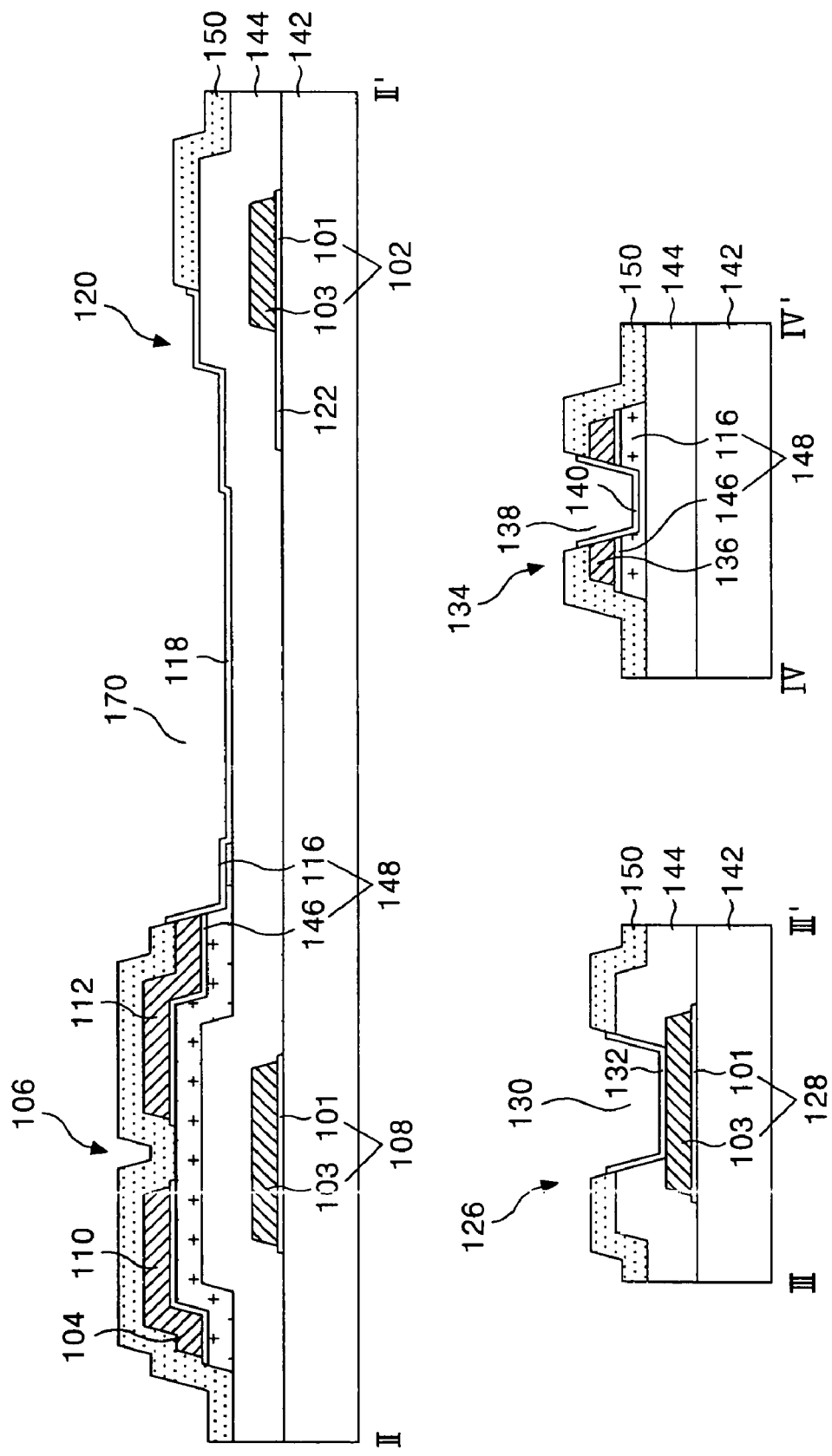

METHOD OF MAKING A LIQUID CRYSTAL DISPLAY DEVICE CAPABLE OF INCREASING CAPACITANCE OF STORAGE CAPACITOR

This application is a divisional of prior application Ser. No. 11/137,411 filed May 26, 2005, now U.S. Pat. No. 7,468,527, and claims the benefit of Korean Patent Application No. P2004-37771 filed in Korea on May 27, 2004, which is hereby incorporated by reference for all purposes as if fully set forth herein.

BACKGROUND OF THE INVENTION

1. Field of the Invention

This invention relates to a liquid crystal display device, and more particularly to a thin film transistor substrate for a thin film transistor and a simplified fabricating method thereof.

2. Description of the Related Art

Generally, a liquid crystal display (LCD) device controls light transmittance of a liquid crystal by adjusting an electric field to display a picture. To this end, the LCD includes a liquid crystal display panel having liquid crystal cells in a matrix type arrangement, and a driving circuit for driving the liquid crystal display panel.

The liquid crystal display panel includes a thin film transistor substrate and a color filter substrate opposed to each other, a liquid crystal injected between two substrates, and a spacer for keep a cell gap between two substrates.

The thin film transistor substrate consists of gate lines, data lines, thin film transistors formed as switching devices at each crossing of the gate lines and the data lines, pixel electrodes formed for each liquid crystal cell and connected to the thin film transistor, and alignment films. The gate lines and the data lines receive signals from the driving circuits via each pad portion. The thin film transistor applies a pixel signal fed to the data line to the pixel electrode in response to a scanning signal fed to the gate line.

The color filter substrate includes color filters formed for each liquid crystal cell, black matrices for dividing color filters and reflecting an external light, common electrodes for commonly applying reference voltages to the liquid crystal cells, and an alignment film formed.

The liquid crystal display panel is completed by preparing the thin film array substrate and the color filter substrate separately, joining them, then injecting a liquid crystal between them and sealing the panel.

In such a liquid crystal display device, the thin film transistor substrate has a complicated fabrication process driving up a manufacturing cost of the liquid crystal display panel because it involves a semiconductor process and needs a plurality of mask process. In order to solve this, the thin film transistor substrate has been developed to allow a reduction in the number of mask processes. This is because one mask process may include a lot of sub-processes such as thin film deposition, cleaning, photolithography, etching, photo-resist stripping and inspection processes, etc. Recently, there has been highlighted a four-round mask process eliminating one mask process from the existent five-round mask process that was a standard mask process of the thin film transistor.

FIG. 1 is a plan view illustrating a thin film transistor substrate adopting a four-round mask process, and FIG. 2 is a section view of the thin film transistor substrate taken along the I-I' line in FIG. 1.

Referring to FIG. 1 and FIG. 2, the thin film transistor substrate includes a gate line 2 and a data line 4 provided on a lower substrate 42 crossing each other with a gate insulating film 44 therebetween, a thin film transistor 6 provided at each crossing, and a pixel electrode 18 provided at a cell area having a crossing structure. Further, the thin film transistor substrate includes a storage capacitor 20 provided at an overlapped portion between the pixel electrode 18 and the pre-stage gate line 2, a gate pad 26 connected to the gate line 2, and a data pad 34 connected to the data line 4.

The thin film transistor 6 allows a pixel signal applied to the data line 4 to be charged into the pixel electrode 18 and kept in response to a scanning signal applied to the gate line 2. To this end, the thin film transistor 6 includes a gate electrode 8 connected to the gate line 2, a source electrode 10 connected to the data line 4, a drain electrode 12 connected to the pixel electrode 18, and an active layer 14 overlapping with the gate electrode 8 and defining a channel between the source electrode 10 and the drain electrode 12.

The active layer 14 overlapping with the source electrode 10 and the drain electrode 12 and having a channel portion between the source electrode 10 and the drain electrode 12 also overlaps with the data line 4, a lower data pad electrode 36 and an upper storage electrode 22. On the active layer 14, an ohmic contact layer 48 for making an ohmic contact with the data line 4, the source electrode 10, the drain electrode 12, the lower data pad electrode 36 and the upper storage electrode 22 is further provided.

The pixel electrode 18 is connected, via a first contact hole 16 passing through a passivation film 50, to the drain electrode 12 of the thin film transistor 6. The pixel electrode 18 generates a potential difference with respect to a common electrode provided at an upper substrate (not shown) by the charged pixel signal. This potential difference rotates a liquid crystal positioned between the thin film transistor substrate and the upper substrate owing to a dielectric anisotropy and transmits a light inputted, via the pixel electrode 18, from a light source (not shown) toward the upper substrate.

The storage capacitor 20 consists of a pre-stage gate ling 2, and upper storage electrode 22 overlapping with the gate line 2 with having the gate insulating film 44, the active layer 14 and the ohmic contact layer 48 therebetween, and a pixel electrode 22 overlapping with the upper storage electrode 22 with having the passivation film 50 therebetween and connected via a second contact hole 24 passing through the passivation film 50. The storage capacitor 20 allows a pixel signal charged in the pixel electrode 18 to be stably maintained until the next pixel voltage is charged.

The gate line 2 is connected, via the gate pad 26, to a gate driver (not shown). The gate pad 26 consists of a lower gate pad electrode 28 extended from the gate line 2, and an upper gate pad electrode 32 connected, via a third contact hole 30 passing through the gate insulating film 44 and the passivation film 50, to the lower gate pad electrode 28.

The data line 4 is connected, via the data pad 34, to the data driver (not shown). The data pad 34 consists of a lower data pad electrode 36 extended from the data line 4, and an upper data pad electrode 40 connected, via a fourth contact hole 38 passing through the passivation film 50, to the lower data pad electrode 36.

Hereinafter, a method of fabricating the thin film transistor substrate having the above-mentioned structure adopting the four-round mask process will be described in detail with reference to FIG. 3A to FIG. 3D.

Referring to FIG. 3A, gate metal patterns including the gate line 2, the gate electrode 8 and the lower gate pad electrode 28 are provided on the lower substrate 42 by the first mask process.

More specifically, a gate metal layer is formed on the lower substrate 42 by a deposition technique such as the sputtering.

Then, the gate metal layer is patterned by the photolithography and the etching process using a first mask to thereby form gate metal patterns including the gate line 2, the gate electrode 8 and the lower gate pad electrode 28. The gate metal layer has a single-layer or double-layer structure of chrome (Cr), molybdenum (Mo) or an aluminum group metal, etc.

Referring to FIG. 3B, the gate insulating film 44 is coated onto the lower substrate 42 provided with the gate metal patterns. Further, a semiconductor pattern including the active layer 48 and the ohmic contact layer 48 and source/drain metal patterns including the data line 4, the source electrode 10, the drain electrode 12, the lower data pad electrode 36 and the upper storage electrode 22 are sequentially provided on the gate insulating film 44 by the second mask process.

More specifically, the gate insulating film 44, an amorphous silicon layer, a $n^+$ amorphous silicon layer and a source/drain metal layer are sequentially provided on the lower substrate 42 provided with the gate metal patterns by deposition techniques such as the plasma enhanced chemical vapor deposition (PECVD) and the sputtering, etc. Herein, the gate insulating film 44 is formed from an inorganic insulating material such as silicon nitride ($SiN_x$) or silicon oxide ($SiO_x$). The source/drain metal is selected from molybdenum (Mo) or a molybdenum alloy, etc.

Then, a photo-resist pattern is formed on the source/drain metal layer by the photolithography using a second mask. In this case, a diffractive exposure mask having a diffractive exposing part at a channel portion of the thin film transistor is used as a second mask, thereby allowing a photo-resist pattern of the channel portion to have a lower height than other source/drain pattern portion.

Subsequently, the source/drain metal layer is patterned by a wet etching process using the photo-resist pattern to thereby provide the source/drain metal patterns including the data line 4, the source electrode 10, the drain electrode 12 being integral to the source electrode 10 and the upper storage electrode 22.

Next, the $n^+$ amorphous silicon layer and the amorphous silicon layer are patterned at the same time by a dry etching process using the same photo-resist pattern to thereby provide the ohmic contact layer 48 and the active layer 14.

The photo-resist pattern having a relatively low height is removed from the channel portion by the ashing process and thereafter the source/drain metal pattern and the ohmic contact layer 48 of the channel portion are etched by the dry etching process. Thus, the active layer 14 of the channel portion is exposed to disconnect the source electrode 10 from the drain electrode 12.

Then, the photo-resist pattern left on the source/drain metal pattern group is removed by the stripping process.

Referring to FIG. 3C, the passivation film 50 including the first to fourth contact holes 16, 24, 30 and 38 are formed on the gate insulating film 44 provided with the source/drain metal patterns.

More specifically, the passivation film 50 is entirely formed on the gate insulating film 44 provided with the source/drain metal patterns by a deposition technique such as the plasma enhanced chemical vapor deposition (PECVD). Then, the passivation film 50 is patterned by the photolithography and the etching process using a third mask to thereby define the first to fourth contact holes 16, 24, 30 and 38. The first contact hole 16 is formed in such a manner to pass through the passivation film 50 and expose the drain electrode 12, whereas the second contact hole 24 is formed in such a manner to pass through the passivation film 50 and expose the upper storage electrode 22. The third contact hole 30 is formed in such a manner to pass through the passivation film 50 and the gate insulating film 44 and expose the lower gate pad electrode 28. The fourth contact hole 38 is formed in such a manner to pass through the passivation film 50 and expose the upper data pad electrode 36.

The passivation film 50 is made from an inorganic insulating material identical to the gate insulating film 44, or an organic insulating material such as an acrylic organic compound having a small dielectric constant, BCB (benzocyclobutene) or PFCB (perfluorocyclobutane), etc.

Referring to FIG. 3D, transparent conductive film patterns including the pixel electrode 18, the upper gate pad electrode 32 and the upper data pad electrode 40 are provided on the passivation film 50 by the fourth mask process.

A transparent conductive film is deposited onto the entire passivation film 50 by a deposition technique such as the sputtering, etc. Then, the transparent conductive film is patterned by the photolithography and the etching process using a fourth mask to thereby provide the transparent conductive film patterns including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the upper storage electrode 22 overlapping with the pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Herein, the transparent conductive film is formed from indium-tin-oxide (ITO), etc.

As described above, the related art thin film transistor substrate and the fabricating method thereof adopt the four-round mask process, thereby reducing the number of processes and hence reducing a manufacturing cost in proportion to the reduction in the number of processes. However, because the four-round mask process still has a complicated fabrication process that limits any reductions in cost, there has been required a thin film transistor substrate and a fabricating method thereof capable of further simplifying the fabricating method and hence reducing further the manufacturing cost.

Furthermore, in the related art thin film transistor substrate, the semiconductor layer including the active layer 14 and the ohmic contact layer 48 is positioned under the upper storage electrode 22 for the sake of the second mask process because the upper storage electrode 22 is formed from a source/drain metal. Due to such a semiconductor layer, the upper storage electrode 22 and the gate line 2 that is a lower storage electrode are relatively far away from each other, thereby reducing a capacitance of the storage capacitor 20, which is inversely proportional to the distance. For this reason, the storage capacitor 20 fails to stably keep a pixel signal charged in the pixel electrode 18.

Moreover, in the related art thin film transistor, the upper and lower electrodes of the storage capacitor 20 are formed from an opaque source/drain metal and a gate metal, respectively. Thus, there arises a problem in that, when an overlapping area between the upper storage electrode 22 and the gate line 2 is enlarged so as to increase a capacitance of the storage capacitor 20, an aperture ratio of the pixel electrode 18 also is reduced by that extent.

SUMMARY OF THE INVENTION

Accordingly, it is an object of the present invention to provide a thin film transistor substrate and a fabricating method thereof that are adaptive for simplifying a process as well as enlarging a capacitance value of a storage capacitor without any reduction of aperture ratio.

In order to achieve these and other objects of the invention, a liquid crystal display device according to an embodiment of the present invention includes: a double-layer structure of gate line, the double layer having a first transparent conductive layer and a second opaque conductive layer and having a step coverage; a data line crossing to the gate line to define a pixel region; a gate insulating film between the gate line and the data line; a thin film transistor connected to the gate line and the data line; a semiconductor layer defining a channel of the thin film transistor and overlapping with the data line; a passivation film covering the data line and the thin film transistor; a pixel electrode on the gate insulating film within a pixel hole of the pixel region passing through the passivation film; and a storage capacitor overlapping with the pixel electrode having the gate insulating film therebetween and having a lower storage electrode extended from the first transparent conductive layer.

The device further includes: a gate pad including a lower gate pad electrode having the double-layer structure connected to the gate line, and an upper gate pad electrode within a contact hole passing through the gate insulating film and the passivation film.

The device further includes: a data pad including a lower data pad electrode connected to the data line, and an upper data pad electrode within a contact hole passing through the passivation film, wherein the semiconductor layer overlaps with the lower data pad electrode.

The pixel electrode is substantially laterally connected to the drain electrode through the pixel hole.

The upper data pad electrode is substantially laterally connected to the lower data pad electrode through the contact hole.

The gate electrode is connected to the gate line.

A method of fabricating a liquid crystal display device according to an embodiment of the present invention includes: forming a gate line and a gate electrode including a double-layer having a transparent conductive layer and a gate pattern including a lower storage electrode having the transparent conductive layer on a substrate using a first mask; forming a gate insulating film covering the gate pattern, and forming a semiconductor layer and a source/drain layer on the gate insulating film using a second mask; and forming a passivation film having a pixel hole and forming a pixel electrode connected to the drain electrode and overlapping with the lower storage electrode on the gate insulating film within the pixel hole using a third mask.

The first mask includes a first half-tone mask.

The second mask includes a diffractive exposure mask.

The third mask includes a second half-tone mask.

The forming a gate line and a gate electrode includes: forming a first conductive layer as the transparent conductive layer and a second conductive layer on the substrate; forming first and second photo-resist patterns having a different thickness on the second conductive layer by a photolithography using the first mask; forming the gate line, the gate electrode and the lower storage electrode by patterning the first and second conductive layers using and etching through the first and second photo-resist patterns; removing the second conductive layer on the lower storage electrode by an etching using the first photo-resist pattern; and removing the first photo-resist pattern.

The second conductive layer remains on the lower storage electrode using the etching.

The method further includes thinning the first photo-resist pattern and removing the second photo-resist pattern using an ashing after forming the gate line, the gate electrode and the lower storage electrode.

The data line overlaps with the semiconductor layer.

The lower storage electrode is protruded from the first conductive layer of the gate line.

The forming a gate line and a gate electrode further includes forming a lower gate pad electrode connected to the gate line, and forming a passivation film further includes forming a contact hole passing through the passivation film and the gate insulating film by exposing the lower gate pad electrode and forming an upper gate pad electrode connected to the lower gate pad electrode within the contact hole.

The lower gate pad electrode includes the double-layer.

The forming a gate insulating film further includes forming the lower data pad electrode connected to the data line, and forming a passivation film further includes forming a second contact hole passing through the passivation film and the upper data pad electrode connected to the lower data pad electrode within the second contact hole.

The forming a passivation film includes: forming a passivation film on the source and drain electrodes; forming first and second photo-resist patterns having a different thickness on the passivation film by a photolithography using the second mask; forming the first contact hole by an etching using the first and second photo-resist patterns; forming the pixel hole and the second contact hole by the etching using the first photo-resist pattern; forming a transparent conductive layer on the first photo-resist pattern; and forming a transparent conductive pattern having the pixel electrode, the upper gate pad electrode and the upper data pad electrode by removing the first photo-resist pattern and the transparent conductive layer using a lift-off.

The method further includes thinning the first photo-resist pattern by an ashing and removing the second photo-resist pattern after forming the first contact hole.

The forming the pixel hole and the second contact hole includes forming an exposed portion of the drain electrode and the lower data pad electrode.

The pixel electrode is substantially laterally connected to the drain electrode.

The upper data pad electrode is substantially laterally connected to the lower data pad electrode.

The forming the pixel hole and the second contact hole includes etching a semiconductor layer under the exposed portion of the drain electrode and the lower data pad electrode.

The forming the pixel hole and the second contact hole includes over-etching the passivation film such that the edge of the first photo-resist pattern is more protruded than the edge of the passivation film.

The first and second conductive layers have constant step coverage.

BRIEF DESCRIPTION OF THE DRAWINGS

These and other objects of the invention will be apparent from the following detailed description of the embodiments of the present invention with reference to the accompanying drawings, in which:

FIG. 3A to FIG. 3D are section views illustrating a method of fabricating the thin film transistor substrate shown in FIG. 2;

FIG. 5 is a section view of the thin film transistor substrate taken along the II-II', III-III' and IV-IV' lines in FIG. 4;

FIG. 7A to FIG. 7E are section views for specifically explaining the first mask process;

FIG. 8A and FIG. 8B are a plan view and a section view for explaining a second mask process of the thin film transistor substrate according to the embodiment of the present invention;

FIG. 9A to FIG. 9E are section views for specifically explaining the second mask process;

FIG. 11A to FIG. 11E are section views for specifically explaining the third mask process;

FIG. 13 is a section view of the thin film transistor substrate taken along the II-II', III-III' and IV-IV' lines in FIG. 12.

DETAILED DESCRIPTION OF THE ILLUSTRATED EMBODIMENTS

Reference will now be made in detail to embodiments of the present invention, examples of which are illustrated in the accompanying drawings.

Hereinafter, the illustrated embodiments of the present invention will be described in detail with reference to FIGS. 4 to 13.

Figure 1:
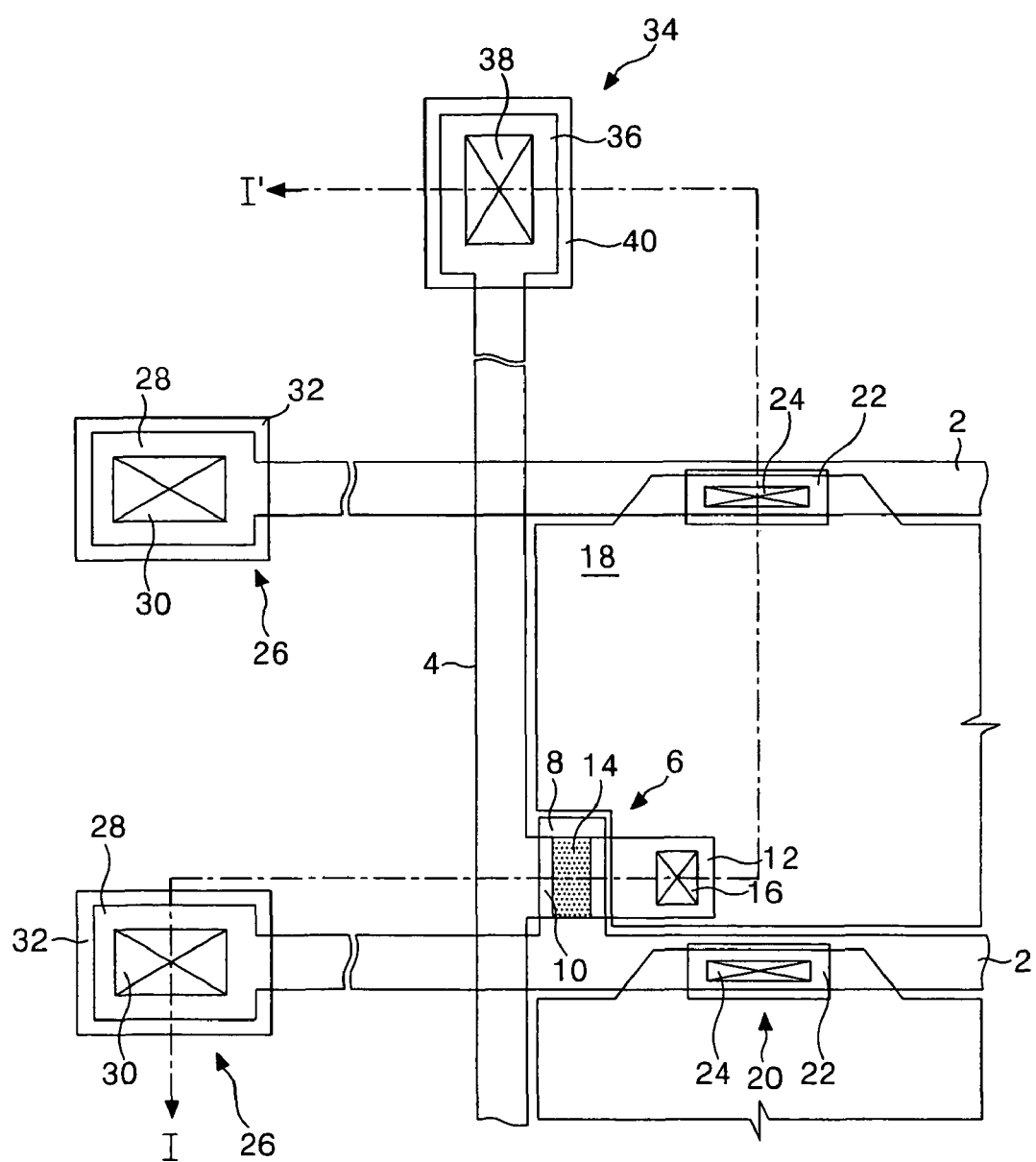
FIG. 1 is a plan view showing a portion of a related art thin film transistor substrate.
Figure 2:
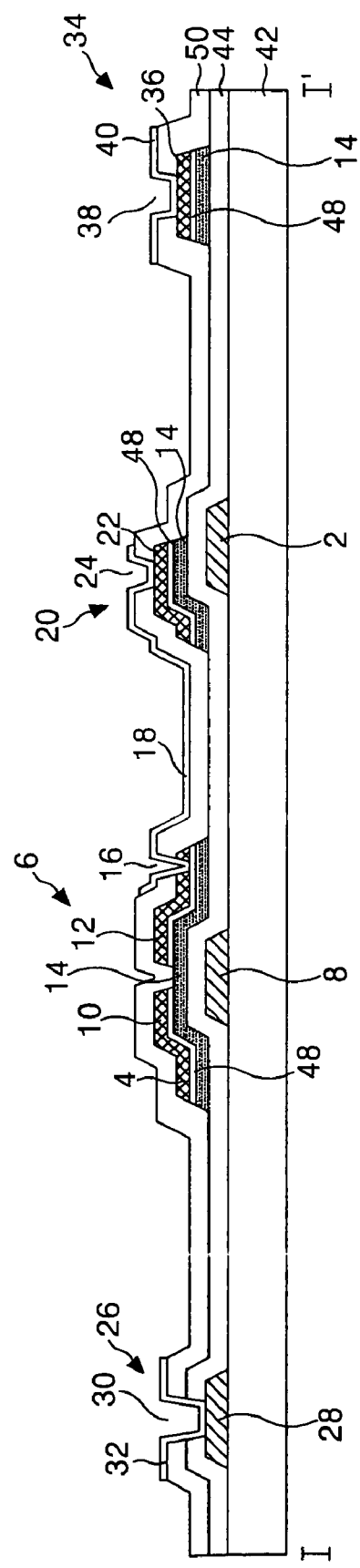
FIG. 2 is a section view of the thin film transistor substrate taken along the I-I' line in FIG. 1.
Figure 3A:
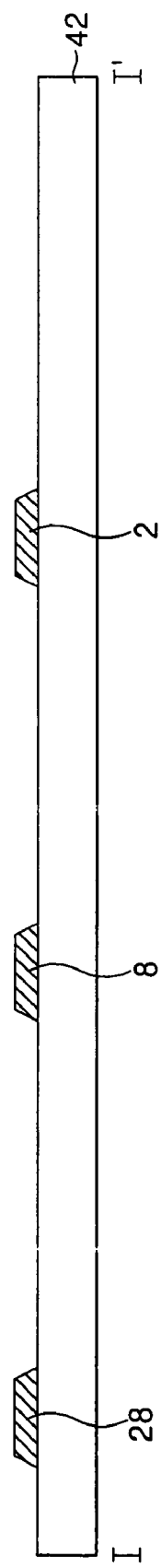
Figure 3C:
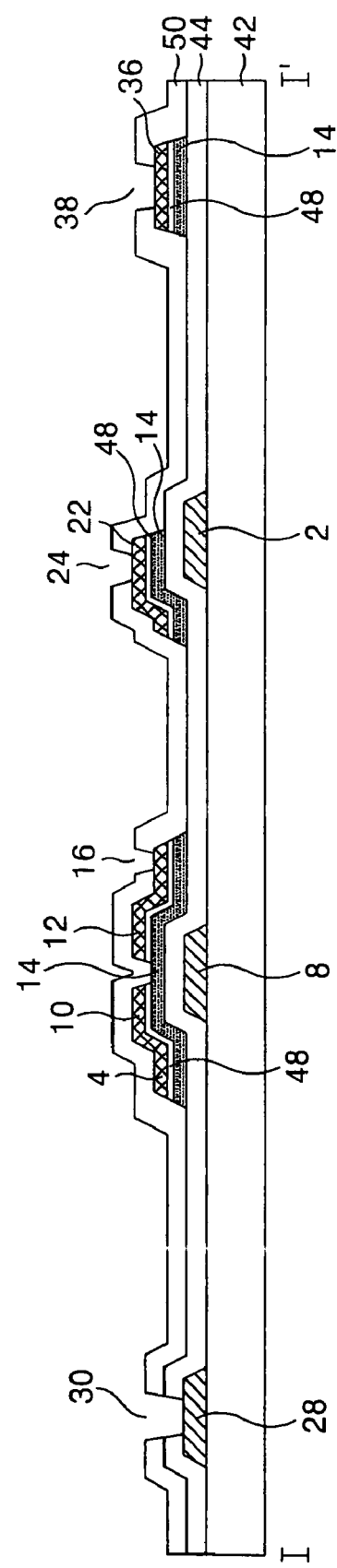
Figure 3D:
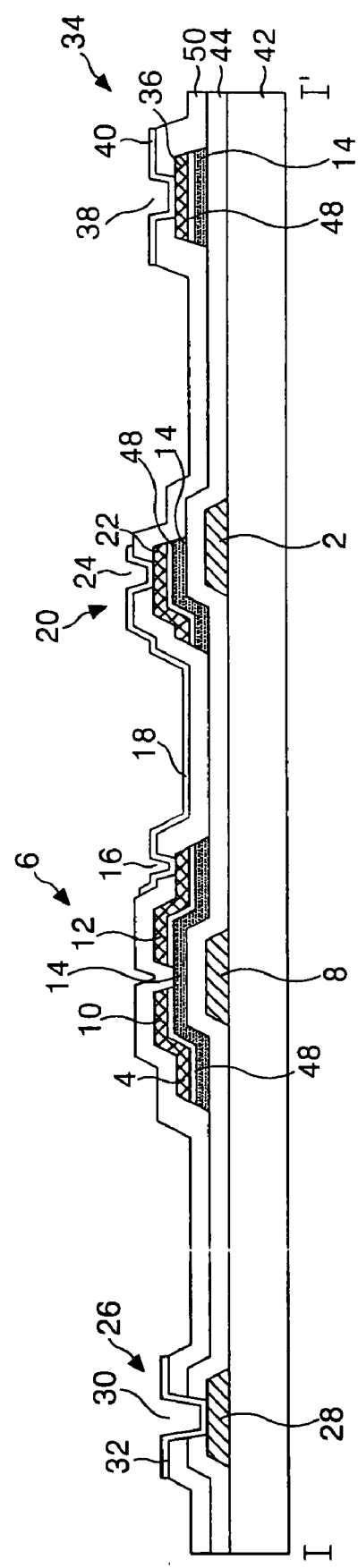
Figure 4:
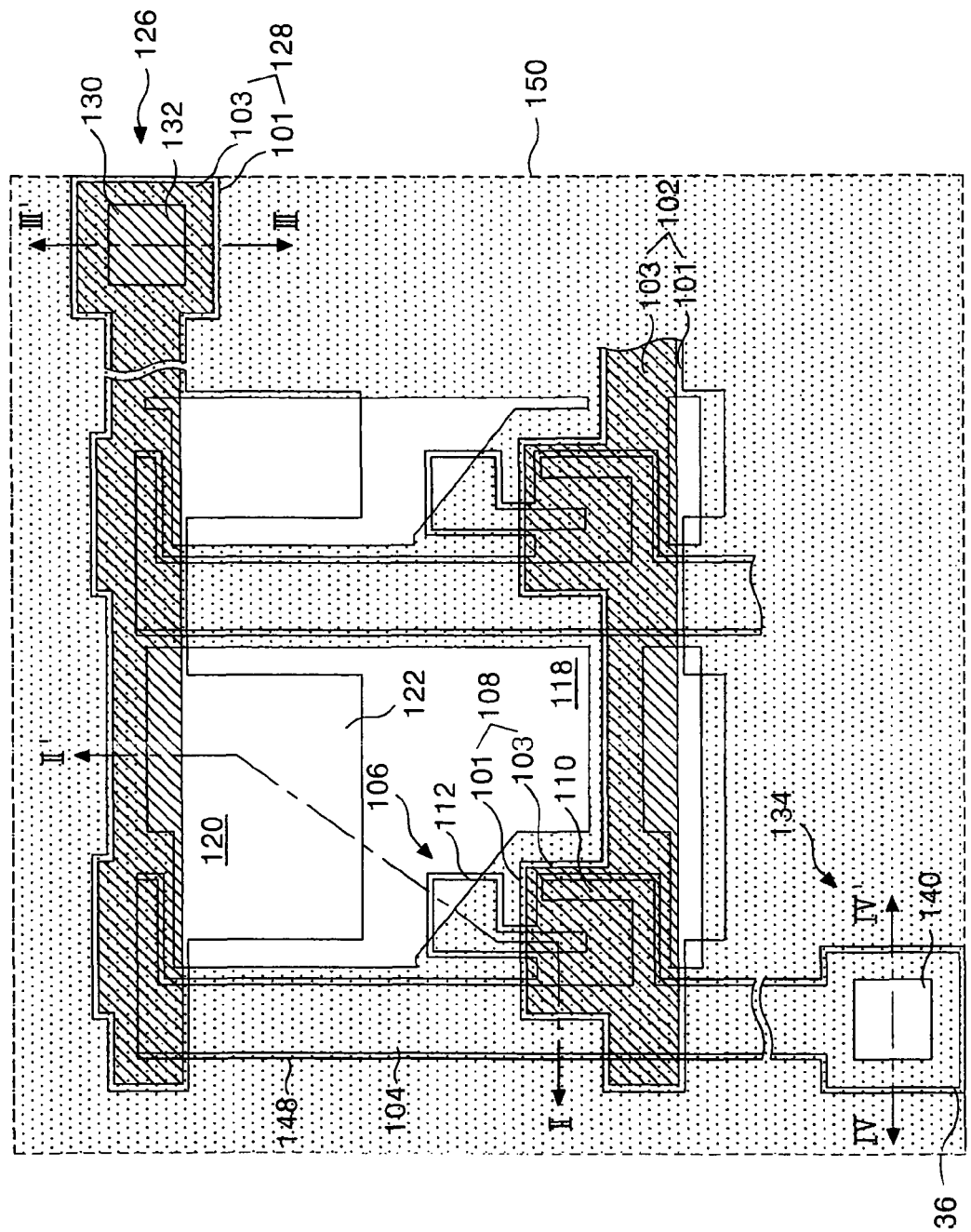
FIG. 4 is a plan view showing a portion of a thin film transistor substrate according to an embodiment of the present invention.

FIG. 4 is a plan view showing a portion of a thin film transistor substrate according to an embodiment of the present invention, and FIG. 5 is a section view of the thin film transistor substrate taken along the II-II', III-III' and IV-IV' lines in FIG. 4.

Referring to FIG. 4 and FIG. 5, the thin film transistor substrate includes a gate line 102 and a data line 104 provided on a lower substrate 142 in such a manner to cross each other with having a gate insulating film 144 therebetween, a thin film transistor 106 being adjacent to each crossing, and a pixel electrode 118 provided at a pixel area defined by the crossing. Further, the thin film transistor substrate includes a storage capacitor 120 provided at an overlapped portion between the pixel electrode 118 and a lower storage electrode 122 protruded from the gate line 102, a gate pad connected to the gate line 102, and a data pad 134 connected to the data line 104.

The thin film transistor 106 allows a pixel signal applied to the data line 104 to be charged into the pixel electrode 118 and be kept in response to a scanning signal applied to the gate line 102. To this end, the thin film transistor 106 includes a gate electrode 108 connected to the gate line 102, a source electrode 110 connected to the data line 104, a drain electrode 110 positioned in opposition to the source electrode 110 to be connected to the pixel electrode 118, an active layer 116 overlapping with the gate electrode 108 with having the gate insulating film 144 therebetween to provide a channel between the source electrode 110 and the drain electrode 112, and an ohmic contact layer 146 formed on the active layer 114 other than the channel portion to make an ohmic contact with the source electrode 110 and the drain electrode 112.

Herein, the gate line 102 and the gate electrode 108 have a double-layer structure in which a first conductive layer 101 formed from a transparent conductive layer and a second conductive layer 103 formed from a metal layer thereon are disposed.

Further, the semiconductor pattern 148 including the active layer 116 and the ohmic contact layer 146 also overlap with the data line 104.

A pixel area defined by a crossing between the gate line 102 and the data line 104 is provided with a pixel hole 170 passing through a passivation film 150. The pixel electrode 118 is formed on the gate insulating film 144 within the pixel hole 170 and makes an interface with the passivation film 150. Further, the pixel electrode 118 is connected to the drain electrode 122 exposed by the pixel hole 170. Such a pixel electrode 118 charges a pixel signal supplied from the thin film transistor 106 to thereby generate a potential difference with respect to a common electrode provided at a color filter substrate (not shown). This potential difference rotates a liquid crystal positioned between the thin film transistor substrate and the color filter substrate owing to a dielectric anisotropy and controls an amount of a light inputted, via the pixel electrode 118, from a light source (not shown) to thereby transmit it into the color filter substrate.

The storage capacitor 120 is formed such that the lower storage electrode 122 protruded from the first conductive layer 101 toward the pixel area overlaps with the pixel electrode 118 with having the gate insulating film 144 therebetween. The lower storage electrode 122 is formed from the first conductive layer 101, that is, a transparent conductive layer, so that an overlapping area between it and the pixel area can be enlarged without a reduction of aperture ratio. Accordingly, it becomes possible to increase a capacitance of the storage capacitor 120 without any reduction of aperture ratio. Furthermore, the pixel electrode 118 and the lower storage electrode 122 overlaps with each other with having only the gate insulating film 144 therebetween to reduce a distance between two electrodes 118 and 122, thereby more increasing a capacitance of the storage capacitor 120. As a result, it becomes possible to keep the signal charged in the pixel electrode 118 more stably.

The gate line 102 is connected, via the gate pad 126, to a gate driver (not shown). The gate pad 126 consists of a lower gate pad electrode 128 extended from the gate line 102, and an upper gate pad electrode 132 provided within a first contact hole 130 passing through the passivation film 150 and the gate insulating film 144 to be connected to the lower gate pad electrode 128. The lower gate pad electrode 128 has a double-layer structure in which the first and second conductive layers 101 and 103 are built like the gate line 102. The upper gate pad electrode 132 makes an interface with the passivation film 150 within the first contact hole 130.

The data line 104 is connected, via a data pad 134, to a data driver (not shown). The data pad 134 consists of a lower data pad electrode 136 extended from the data line 104, and an upper data pad electrode 140 formed within a second contact hole 138 passing through the passivation film 150 to be connected to the lower data pad electrode 136. The semiconductor layer 148 including the ohmic contact layer 146 and the active layer 114 is formed under the lower data pad electrode 136 in such a manner to overlap with it. The upper data pad electrode 140 makes an interface with the passivation film 150 within the second contact hole 138.

As described above, the thin film transistor substrate according to the embodiment of the present invention forms the lower storage electrode 122 overlapping with the pixel electrode 118 from a transparent conductive layer, so that it can increase a capacitance of the storage capacitor 120 without any reduction of aperture ratio. Accordingly, a line width of the gate line 102 can be reduced independently of an overlapping area between the gate line 102 and the pixel electrode 118, thereby having an advantage in making a high definition.

The thin film transistor substrate according to the embodiment of the present invention having the above-mentioned structure is formed by the following three-round mask process.

Figure 6A:
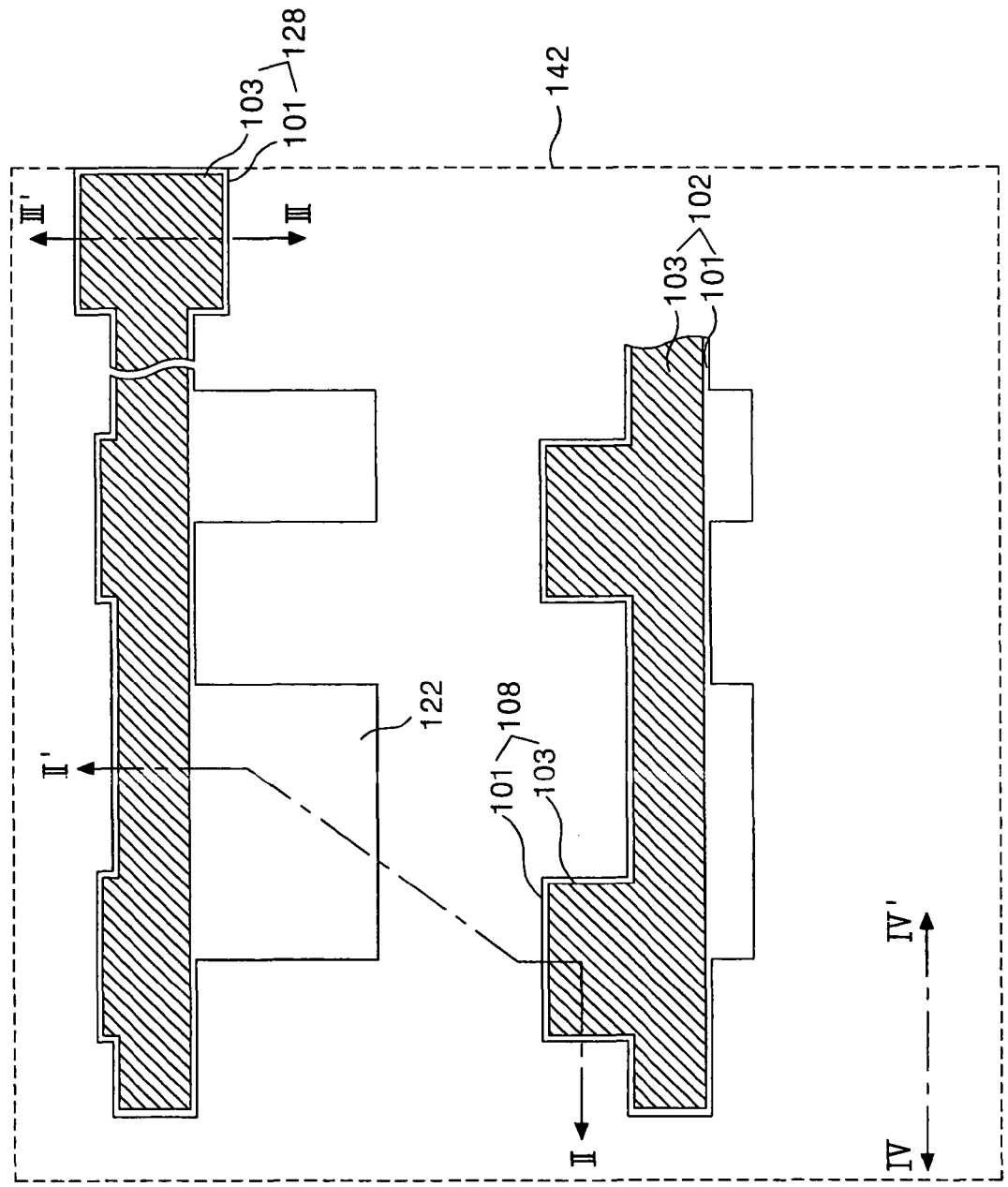
FIG. 6A and FIG. 6B are a plan view and a section view for explaining a first mask process of the thin film transistor substrate according to the embodiment of the present invention.
Figure 6B:
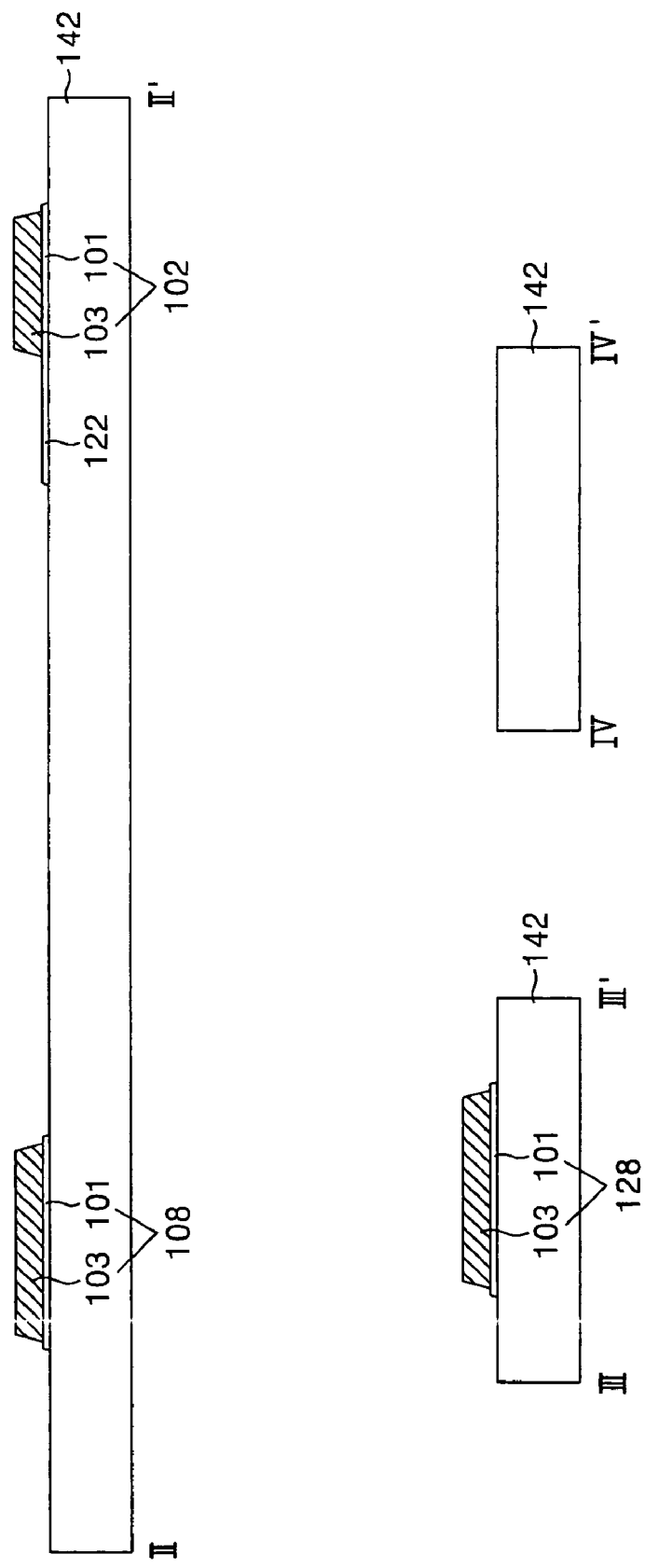

FIG. 6A and FIG. 6B are a plan view and a section view for explaining a first mask process, respectively, in a method of fabricating the thin film transistor substrate according to the embodiment of the present invention, and FIG. 7A to FIG. 7E are section views for specifically explaining the first mask process.

A gate metal pattern including the gate line 102, the gate electrode 106 connected to the gate line 102, the lower gate pad electrode 128 and the lower storage electrode 122 is formed on the lower substrate 142 by the first mask process. The gate line 102, the gate electrode 108 and the lower gate pad electrode 128 take a double-layer structure in which the first and second conductive layers 101 and 103 are built, whereas the lower storage electrode 122 takes a single-layer structure in which the first conductive layer 101 of the gate line 102 is extended. The gate pattern having the above-mentioned double-layer and single-layer structure is formed by a single of mask process using a half tone mask 160.

Figure 7A:
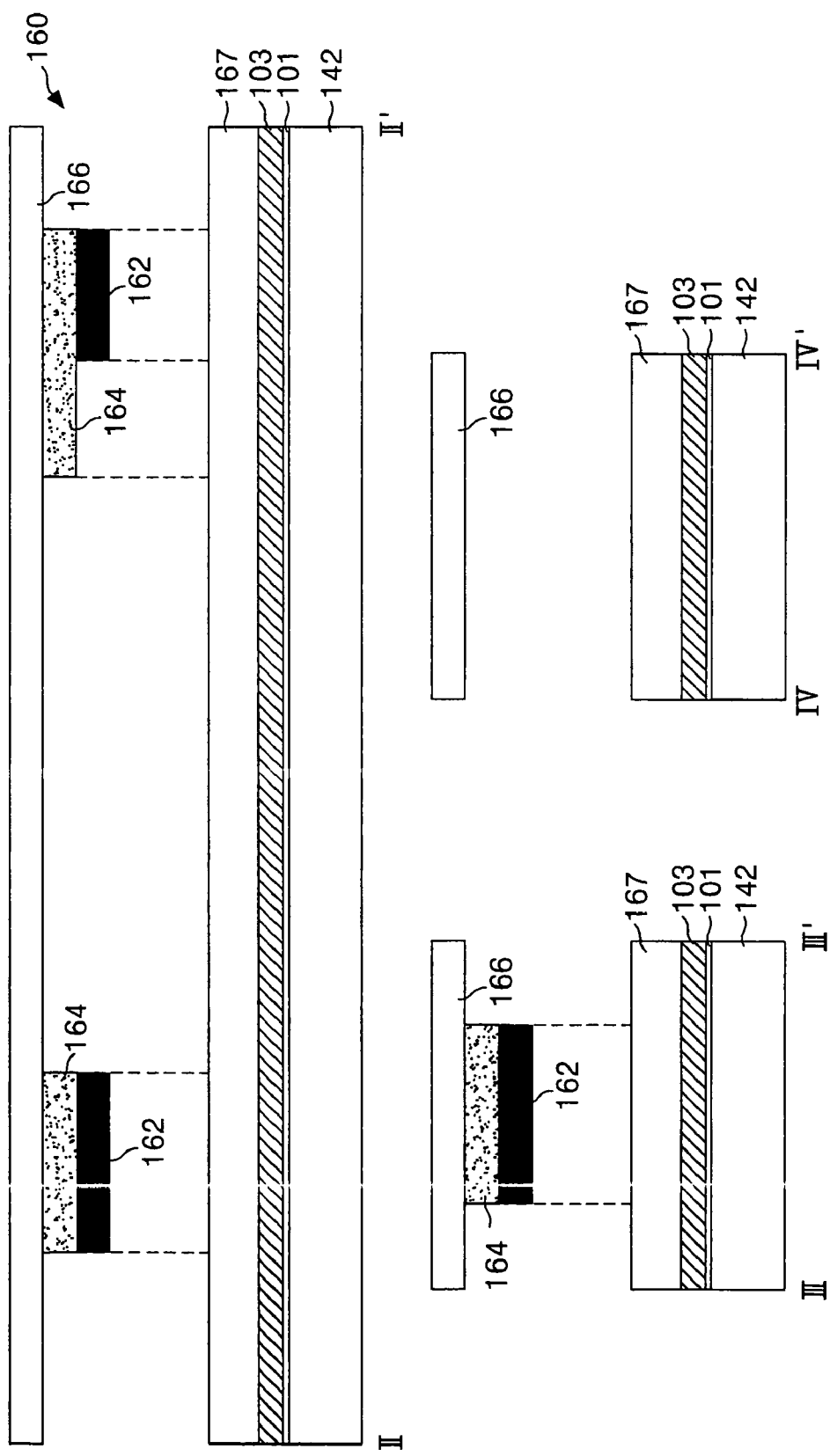

More specifically, as shown in FIG. 7A, the first and second conductive layers 101 and 103 are built on the lower substrate 142 by a deposition technique such as the sputtering, and a photo-resist 176 is formed thereon. The first conductive layer is formed from a transparent conductive material such as indium-tin-oxide (ITO), tin-oxide (TO), indium-zinc-oxide (IZO) or the like. The second conductive layer 103 is formed from a metal material such as Mo, Cu, Al, Ti, Cr, MoW or AlNd, etc.

Further, a third conductive layer may be provided on the second conductive layer 103. In this case, the first conductive layer is formed from a transparent conductive layer such as ITO, IZO, TO or the like; the second conductive layer is formed from a metal layer such as Mo, Ti, Cu, Al(Nd) group or the like; and the third conductive layer is formed from a metal layer such as Cu, Al, Ti, Mo, Al(Nd) group or the like. Alternatively, the second and third conductive layers may be formed from a combination of the above group. For example, they are formed from Mo/ITO, Al(Nd)ITO, Cu/ITO, Cu/Ti/ITO, Cu/Mo/ITO, Cu/Mo/ITO, Cu/Mo+Ti/ITO, Al(Nd)/Mo/ITO or the like. This means that, when Mo/ITO beyond the double-layer is described, for example, ITO should be formed firstly and Mo should formed later.

Next, the photo-resist 167 is exposed to the light and developed by the photolithography using the half tone mask 160, thereby forming a photo-resist pattern having a step coverage as shown in FIG. 7B.

The half tone mask 160 includes a transparent quartz ($SiO_2$) substrate 166, and a shielding layer 162 and a partial transmitting layer 164 formed thereon. Herein, the shielding layer 162 is positioned at an area to be provided with a gate pattern to shut off an ultraviolet ray (UV), thereby leaving a first photo-resist pattern 168A after a development thereof. The partial transmitting layer 164 is positioned at an area to be provided with the lower storage electrode to partially transmit the UV, thereby leaving a second photo-resist pattern thinner than the first photo-resist pattern. To this end, the shielding layer is made from a metal such as Cr, $CrO_x$ or the like, whereas the partial transmitting layer 164 is made from $MoSi_x$.

Subsequently, the first and second conductive layers 101 and 103 are patterned by an etching process using the photo-resist pattern having a step coverage to thereby provide a double-layer structure of gate pattern as shown in FIG. 7C.

Then, the photo-resist pattern 168 is ashed by the ashing process using an oxygen ($O_2$) plasma to thereby thinned the thickness of the first photo-resist pattern and remove the second photo-resist pattern as shown in FIG. 7D. Further, the second conductive layer 103 on the lower storage electrode 122 is removed by an etching process using the ashed first photo-resist pattern 168. Thus, the lower storage electrode 122 can be formed from only the first conductive layer 101 without a miss-alignment to the second conductive layer 103 included in the gate line 102. At this time, each side of the second conductive layer 103 patterned along the ashed first photo-resist pattern 168A is once more etched, thereby allowing the first and second conductive layers 101 and 103 of the gate pattern to have a certain step coverage in a stepwise shape. Accordingly, when the side surfaces of the first and second conductive layers 101 and 103 has a high steep slope, it becomes possible to prevent a breakage badness of the source/drain metal layer that may be generated thereon.

Meanwhile, the etching process of the first and second conductive layers 101 and 103 selectively applies a wet etching or a dry etching. For instance, if all the first and second conductive layers 101 and 103 are etched, then the etching process of the first and second layers 101 and 103 as shown in FIG. 7C, the ashing process of the photo-resist pattern and the etching process of the exposed second conductive layer 103 are successively performed at the same chamber, so that an advantage of a process simplification can be obtained.

Alternatively, the etching process of the exposed second conductive layer 103 may apply a wet etching. For another example, the first and second conductive layers 101 and 103 may apply a wet etching as shown in FIG. 7C, and both the ashing process and the etching process of the exposed second conductive layer 103 may apply a dry etching or the etching process of the exposed second conductive layer 103 only may apply a wet etching as shown in FIG. 7D. Otherwise, the second conductive layer 103 performs a wet etching while the first conductive layer 101 performs a dry etching, or the second conductive layer 103 performs a dry etching and the first conductive layer 101 performs a wet etching; and thereafter both the ashing process and the etching process of the exposed second conductive layer 103 apply a dry etching or only the etching process of the exposed second conductive layer 103 applies a wet etching.

Accordingly, a dry etching is advantageous when it is applied to a high-definition model, whereas a set etching is advantageous when it is applied to a high-dimension model. Further, a dry etching is advantageous when the second conductive layer 103 is formed of Mo, whereas a wet etching is advantageous when the second conductive layer 103 is formed of Cu or Al.

Consequently, the photo-resist pattern 168A left on the gate pattern is removed by the stripping process as shown in FIG. 7E.

Figure 8A:
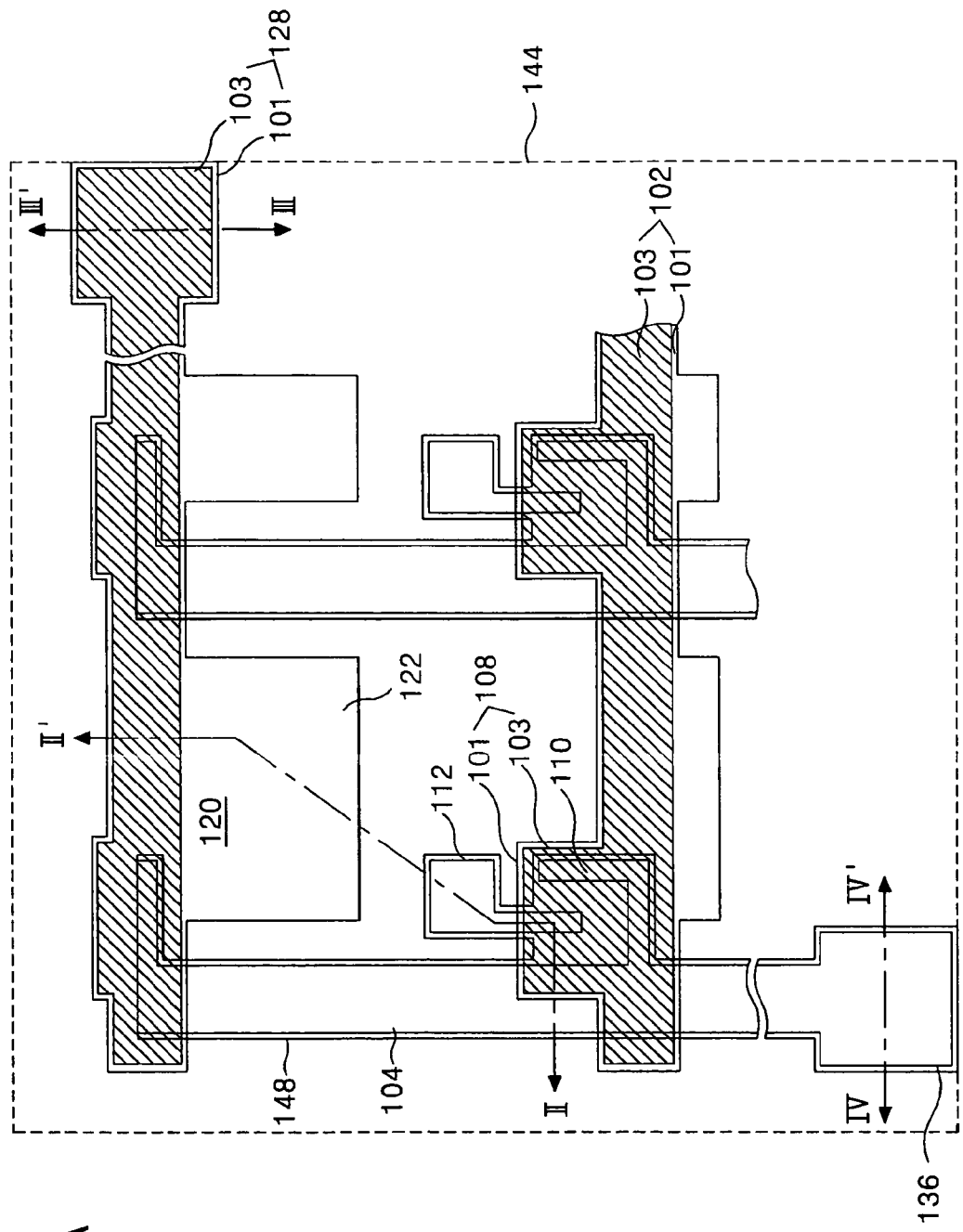

FIG. 8A and FIG. 8B are a plan view and a section view for explaining a second mask process, respectively, in a method of fabricating the thin film transistor substrate according to the embodiment of the present invention, and FIG. 9A to FIG. 9D are section views for explaining the second mask process in detail.

Firstly, the gate insulating film 144 is formed on the lower substrate 142 provided with the gate pattern. Further, the source/drain pattern including the data line 104, the source electrode 110, the drain electrode 112 and the lower data pad electrode 136 and the semiconductor pattern 148 including the active layer 116 and the ohmic contact layer 146 overlapping with each other along the rear side of the source/drain pattern are formed thereon. The semiconductor pattern 148 and the source/drain pattern are formed by a single mask process using a diffractive exposure mask.

More specifically, the gate insulating film 144, an amorphous silicon layer 115, an amorphous silicon layer 145 being doped with an $n^+$ or $p^+$ impurity and the source/drain metal layer 105 are sequentially formed on the lower substrate 142 provided with the gate pattern. For instance, the gate insulating film 144, the amorphous silicon layer 115 and the amorphous silicon doped with the impurity are formed by the PECVD, whereas the source/drain metal layer 105 is formed by the sputtering. The gate insulating film 144 is formed from an inorganic insulating material such as silicon nitride ($SiN_x$) or silicon oxide ($SiO_x$), whereas the source/drain metal layer 105 is formed of Cr, MoW, Cr/Al, Cu, Al(Nd), Mo/Al, Mo/Al(Nd) or Cr/Al(Nd), etc. For example, a double layer of Al/Cr means that Cr should be formed firstly and Al should be formed later.

Further, a photo-resist 219 is formed onto the source/drain metal layer 105 and then is exposed to the light and developed by the photolithography using a diffractive exposure mask 210, thereby providing a photo-resist pattern 220 having a step coverage as shown in FIG. 9B.

The diffractive exposure mask 210 includes a transparent quartz substrate 212, a shielding layer formed from a metal layer such as Cr, $CrO_x$ or the like, and a diffractive exposure slit 216. The shielding layer 214 is positioned at an area to be provided with the semiconductor pattern and the source/drain pattern to shut off an ultraviolet ray (UV), thereby leaving a first photo-resist pattern 220A after a development thereof. The diffractive exposure slit 216 is positioned at an area to be provided with a channel of the thin film transistor to diffract the UV, thereby leaving a second photo-resist pattern 220B thinner than the first photo-resist pattern 220A.

Subsequently, the source/drain metal layer 105 is patterned by an etching process using the photo-resist pattern 220 having a step coverage to thereby provide the source/drain pattern and the semiconductor pattern 149 under it as shown in FIG. 9C. In this case, the source 110 and the drain electrode 112 of this source/drain pattern has an integral structure.

Figure 9D:
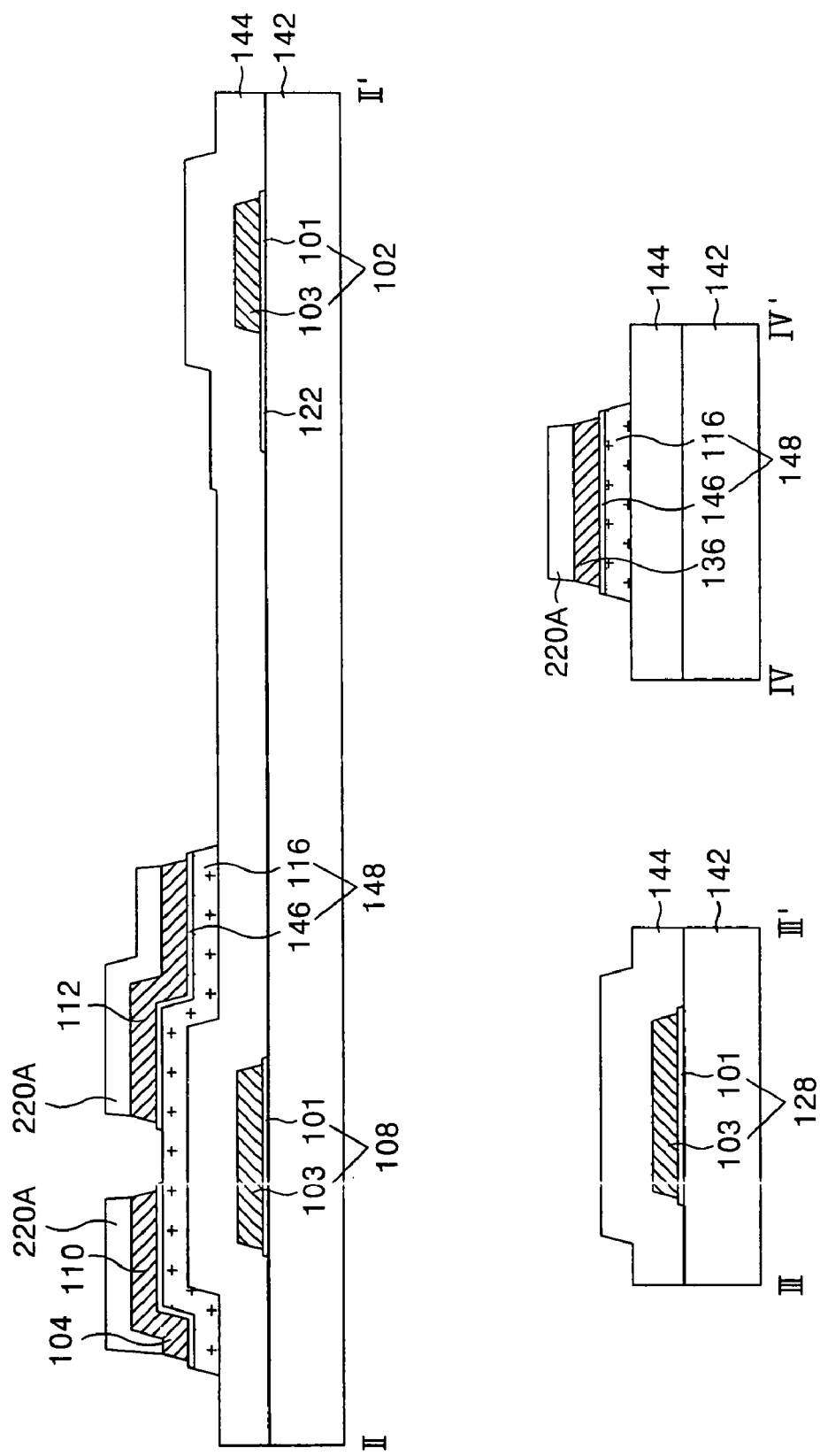

Then, the photo-resist pattern 220 is ashed by the ashing process using an oxygen ($O_2$) plasma to thereby thinned the thickness of the first photo-resist pattern 220A and remove the second photo-resist pattern 220B as shown in FIG. 9D. Further, the source/drain pattern exposed by a removal of the second photo-resist pattern and the ohmic contact layer under it is removed by an etching using the ashed first photo-resist pattern 220A, thereby disconnecting the source electrode 110 from the drain electrode 112 and exposing the active layer 116. Thus, a channel including the active layer 116 is provided between the source electrode 1110 and the drain electrode 112. At this time, each side of the source/drain pattern is once more etched along the ashed first photo-resist pattern 220A to thereby provide the source/drain pattern and semiconductor pattern 148 having a step coverage in a stepwise shape.

Figure 9E:
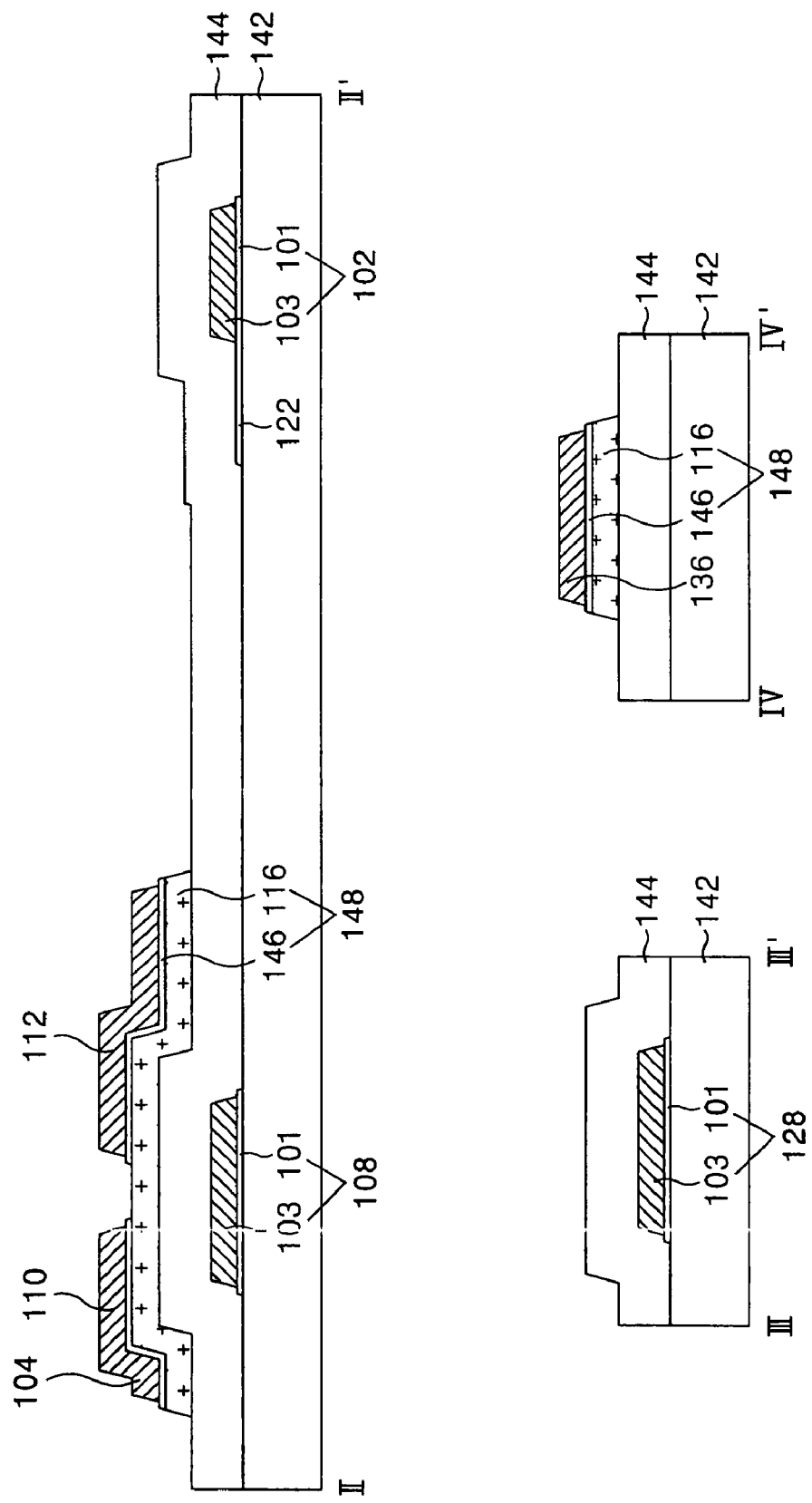

Consequently, the photo-resist pattern 220A left on the source/drain pattern is removed by the stripping process as shown in FIG. 9E.

Figure 10A:
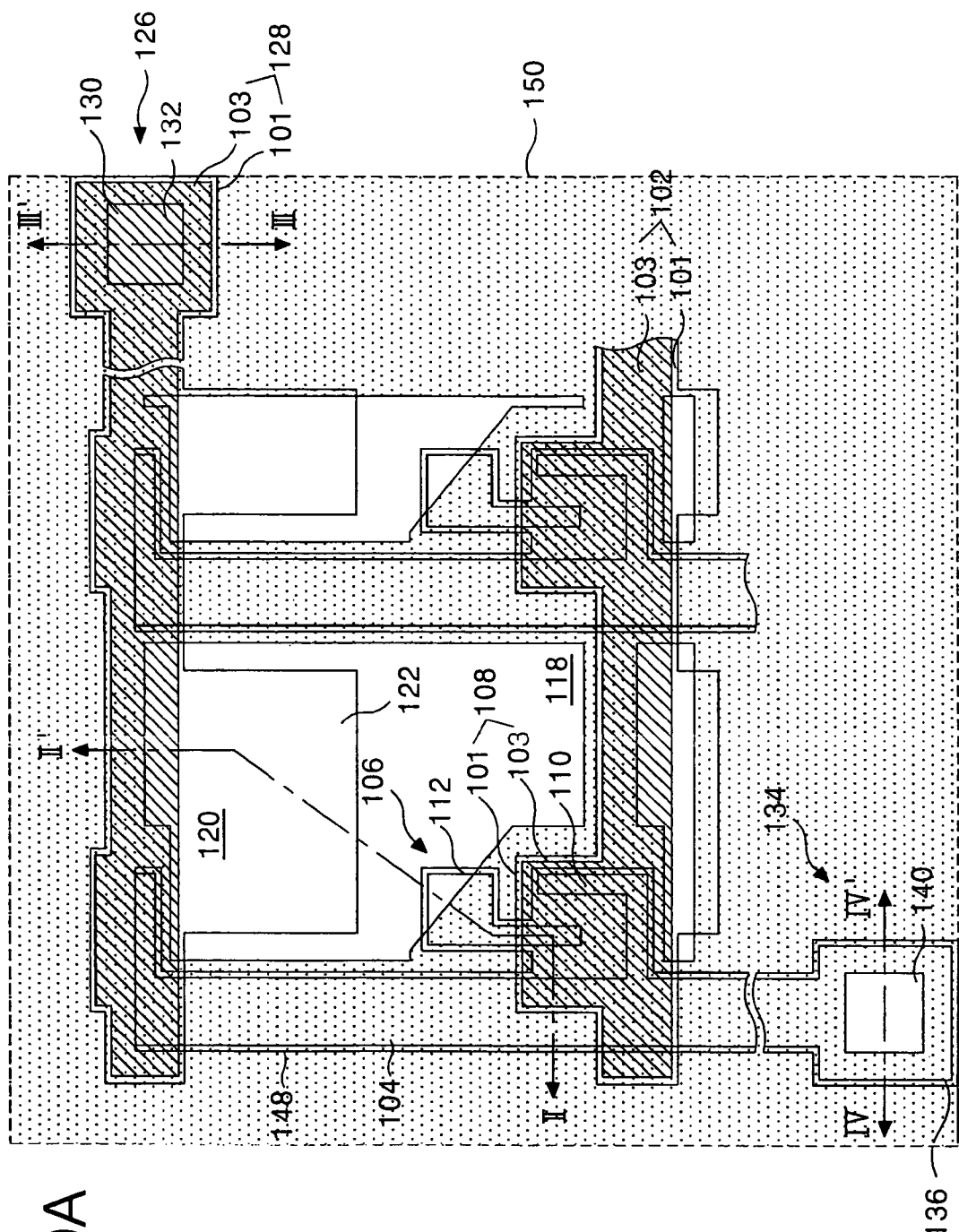
FIG. 10A and FIG. 10B are a plan view and a section view for explaining a third mask process of the thin film transistor substrate according to the embodiment of the present invention.
Figure 10B:
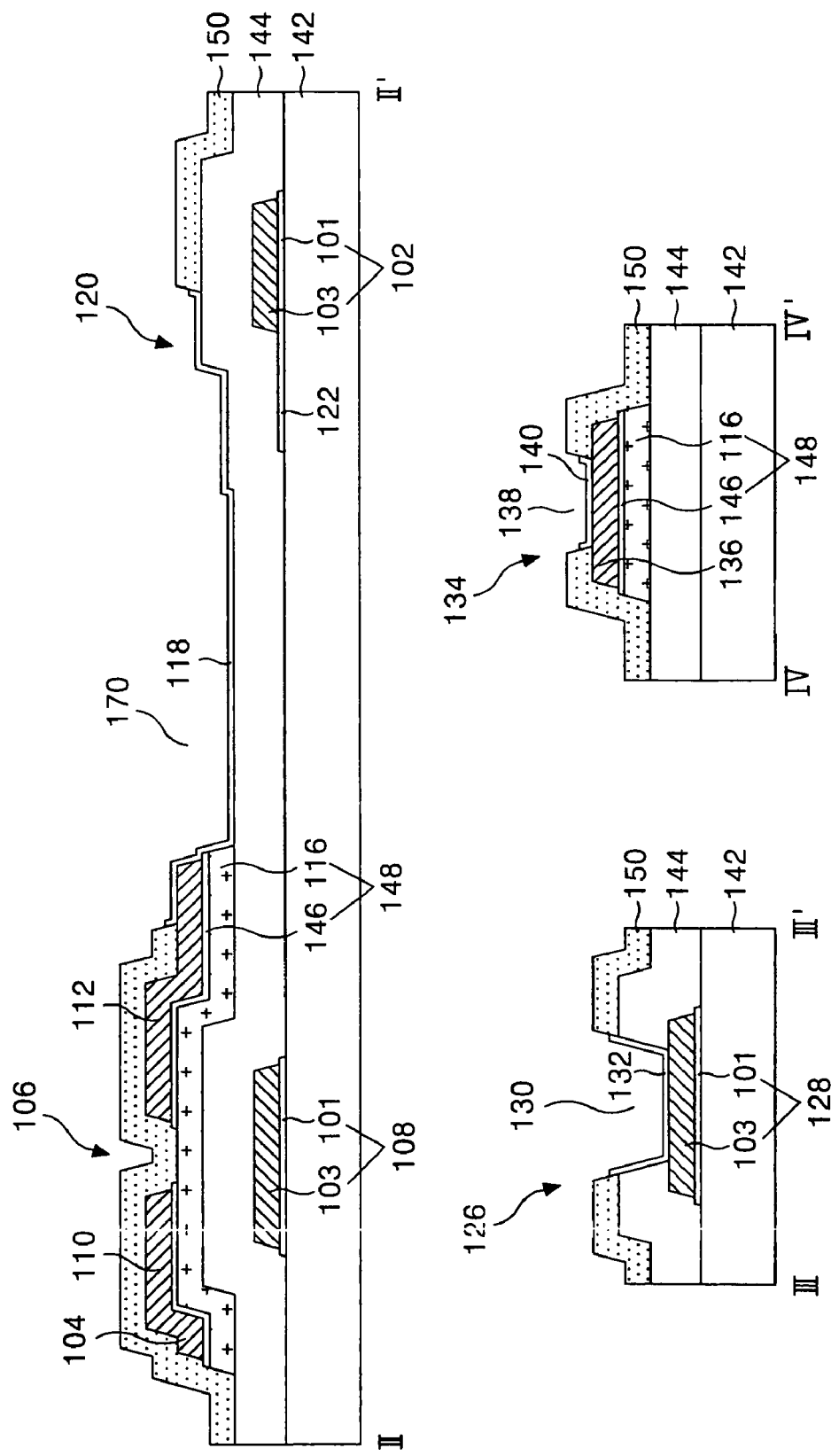

FIG. 10A and FIG. 10B are a plan view and a section view for explaining a third mask process of the thin film transistor substrate according to the embodiment of the present invention, respectively, and FIG. 11A to FIG. 11E are section views for specifically explaining the third mask process.

The passivation film 150 having the pixel hole 170 and the first and second contact holes 130 and 138; and a transparent conductive pattern including the pixel electrode 118, the upper gate pad electrode 132 and the upper data pad electrode 140 are formed by the third mask process.

Figure 11A:
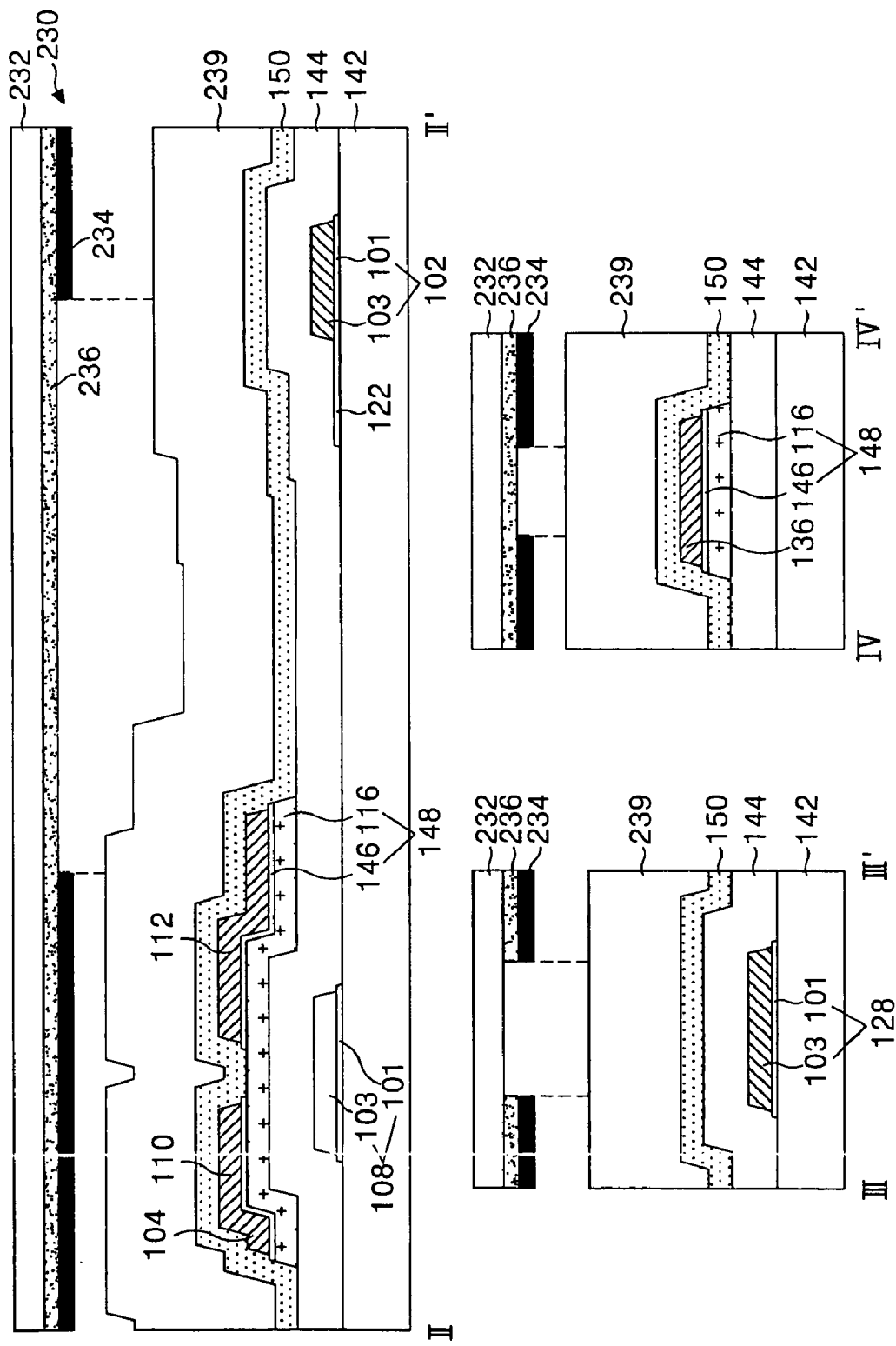

More specifically, as shown in FIG. 11A, the passivation film 150 is formed on the gate insulating film 144 provided with the source/drain pattern by a technique such as the PECVD and the spin coating, etc. and the photo-resist 239 is formed thereon. The passivation film 150 is formed of an inorganic insulating material identical to the gate insulating film 144, or an organic insulating material such as an acrylic organic compound having a small dielectric constant, BCB (benzocyclobutene) or PFCB (perfluorocyclobutane), etc.

Next, the photo-resist 239 is exposed to the light and developed by the photolithography using the half tone mask 160, thereby forming a photo-resist pattern 240 having a step coverage as shown in FIG. 11B.

The half tone mask 230 includes a transparent quartz ($SiO_2$) substrate 232, and a shielding layer 234 and a partial transmitting layer 236 formed thereon. Herein, the shielding layer 234 is positioned at an area at which the passivation film must exist to shut off an ultraviolet ray (UV), thereby leaving a first photo-resist pattern 240A after a development thereof. The partial transmitting layer 236 is positioned at an area to be provided with the pixel hole 170 and the second contact hole 138 passing through the passivation film 150 to partially transmit the UV, thereby leaving a second photo-resist pattern 240B thinner than the first photo-resist pattern 240A after its development. To this end, the shielding layer 234 is made from a metal such as Cr, $CrO_x$ or the like, whereas the partial transmitting layer 236 is made from $MoSi_x$. Further, the quartz substrate 232 only is positioned at an area to be provided with the first contact hole 130 passing through the passivation film 150 and the gate insulating film 144 to entirely transmit the UV, thereby preventing an existence of the photo-resist pattern 240.

Subsequently, the passivation film 150 and the gate insulating film 144 are patterned by an etching process using the photo-resist pattern 240 having a step coverage, thereby providing the first contact hole 130 passing through the passivation film 150 and the gate insulating film 144 to expose the lower gate pad electrode 128 as shown in FIG. 11C.

Then, the photo-resist pattern 240 is ashed by the ashing process using an oxygen ($O_2$) plasma to thereby thinned the thickness of the first photo-resist pattern 240A and remove the second photo-resist pattern 240B as shown in FIG. 11C. Further, the passivation film 150 exposed by the dry etching process using the ashed first photo-resist pattern 240A is removed to provide the pixel hole 170 exposing the drain electrode 112 and the gate insulating film 144 and the second contact hole 138 exposing the upper data pad electrode 136. Herein, the edge of the first photo-resist pattern 240A ashed by an over etching of the passivation film 150 has a shape more protruded than that of the passivation film 150. Such ashing and dry etching processes are successively performed at the same chamber.

Figure 11D:
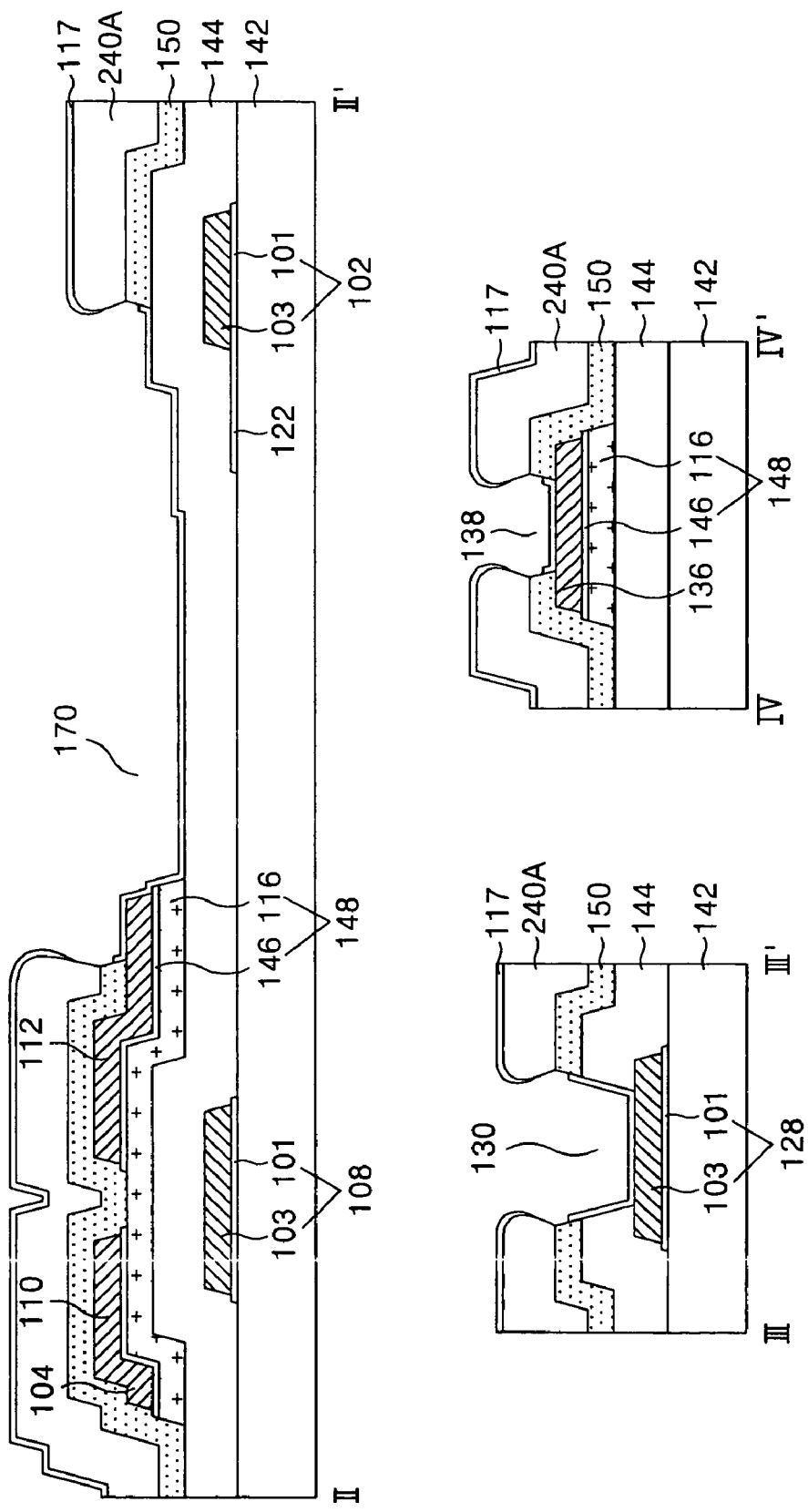

Next, as shown in FIG. 11D, the transparent conductive film 117 is entirely formed on the thin film transistor substrate provided with the first photo-resist pattern 240A by a deposition technique such as the sputtering, etc. The transparent conductive film 117 is made from ITO, IO or IZO, etc. In this case, the transparent conductive film 117 deposited with a linearity by the edge of the first photo-resist pattern 240A is opened at the edge of the passivation film 150 to provide a stripper infiltration path.

The, the first photo-resist pattern 240 and the transparent conductive film 117 thereon are removed simultaneously by a lift-off process to thereby provide the transparent conductive pattern including the pixel electrode 118, the upper gate pad electrode 132 and the upper data pad electrode 140 as shown in FIG. 11E. At this time, a stripper is easily infiltrated, via the infiltration path formed by an opening of the transparent conductive film 117, from the edge of the passivation film 150, so that a lift-off efficiency can be improved. The pixel electrode 118 makes an interface with the passivation film 150 within the pixel hole 170, and is provided on the gate insulating film 144 to be connected to the drain electrode 112. The upper gate pad electrode 132 makes an interface with the passivation film 150 within the first contact hole 130, and is connected to the lower gate pad electrode 128. The upper data pad electrode 132 makes an interface with the passivation film 150 within the second contact hole 138, and is connected to the lower data pad electrode 136.

As described above, the method of fabricating the thin film transistor substrate according to the embodiment of the present invention forms the gate pattern having a double-layer structure and the lower storage electrode 122 having a single-layer structure using the half-tone mask. Further, it forms the pixel hole 170 and the second contact hole 138 passing through the passivation film 150 and the first contact hole 130 passing through the passivation film 150 and the gate insulating film 144 using other half-tone mask. Furthermore, the method of fabricating the thin film transistor substrate according to the embodiment of the present invention patterns the transparent conductive film by the lift-off process of the photo-resist pattern used upon patterning of the passivation film 150 to provide the transparent conductive pattern. As a result, it becomes possible to simplify a process by the three-round mask process.

Moreover, the method of fabricating the thin film transistor substrate according to the embodiment of the present invention applies the half-tone mask when it is intended to relatively thinly define a thickness of the photo-resist pattern corresponding to a relatively larger area like the lower storage electrode 122 and the pixel hole 170, whereas it employs the diffractive exposure mask when it is intended to relatively thinly define a thickness of the photo-resist pattern corresponding to a relatively smaller area like the channel of the thin film transistor 106. Thus, it becomes possible to improve the process efficiency.

Figure 12:
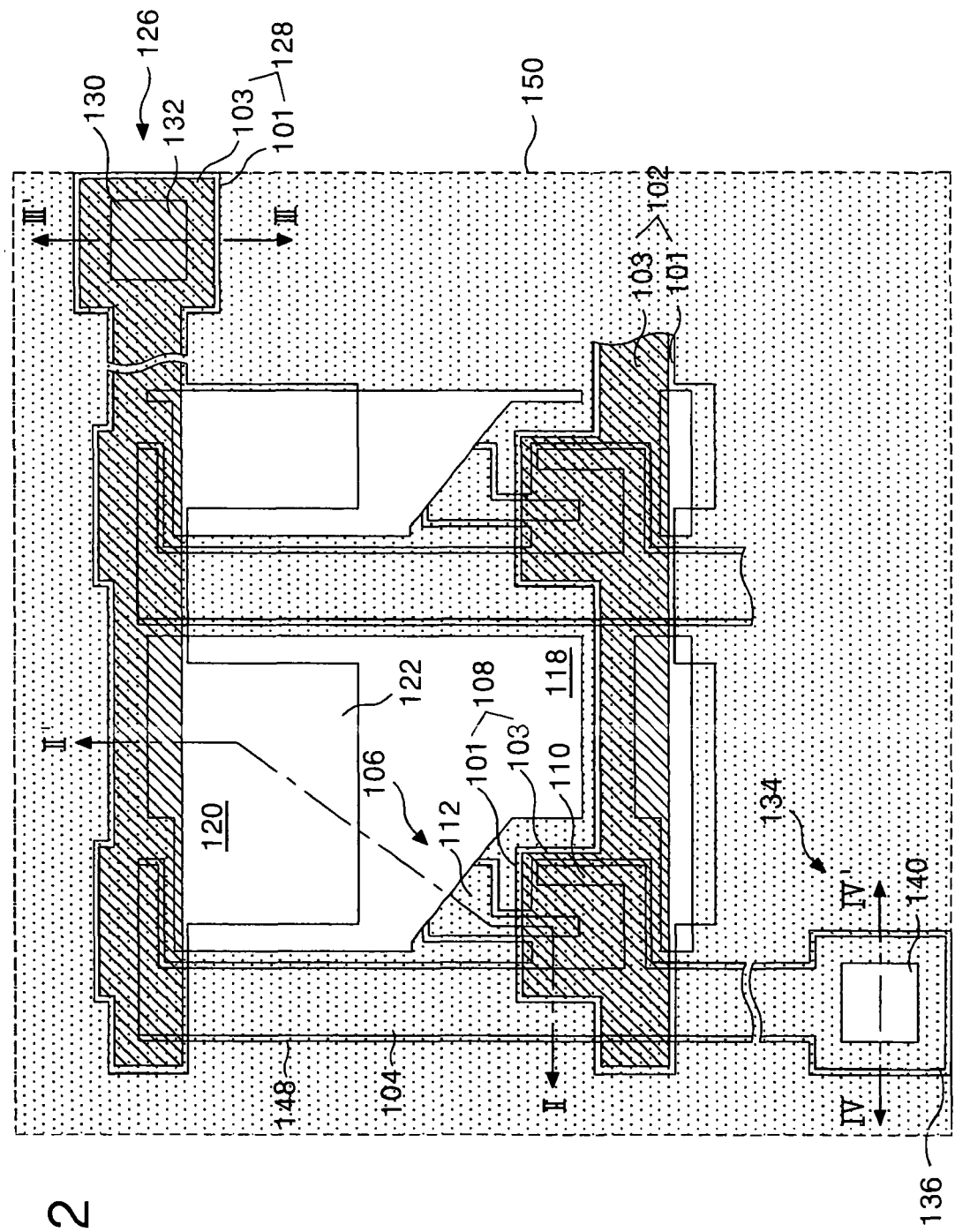
FIG. 12 is a plan view showing a portion of a thin film transistor substrate according to a second embodiment of the present invention.

FIG. 12 is a plan view showing a portion of a thin film transistor substrate according to a second embodiment of the present invention, and FIG. 13 is a section view of the thin film transistor substrate taken along the II-II', III-III' and IV-IV' lines in FIG. 12.

The thin film transistor substrate shown in FIG. 12 and FIG. 13 has the same elements as the thin film transistor shown in FIG. 4 and FIG. 5 except that the pixel electrode 118 is connected, on a side basis, to the drain electrode 112 exposed through the pixel hole 170; and the upper data pad electrode 140 is connected, on a side basis, to the lower data pad electrode 136 exposed through the second contact hole 138. Therefore, an explanation as to the same elements will be omitted.

When the source/drain pattern including the data line 104, the source electrode 110, the drain electrode 112 and the lower data pad electrode 136 is formed of Mo feasible to the dry etching, an exposed portion of the drain electrode 112 and the lower data pad electrode 136 are etched upon formation of the pixel hole 170 and the second contact hole 138 passing through the passivation film 150. In this case, the semiconductor pattern positioned under the exposed portion of the drain electrode 112 and the lower data pad electrode 136 also is etched. Thus, the pixel electrode 118 provided within the pixel hole 170 is connected to the side surface of the drain electrode 112, and is in contact with the residual active layer 116 or the gate insulating film 144. Further, the upper data pad electrode 140 provided within the second contact hole 138 is connected to the side surface of the lower data pad electrode 136, and is in contact with the residual active layer 116 or the gate insulating film 144.

As described above, according to the present invention, the upper and lower electrodes of the storage capacitor are formed from a transparent conductive layer to enlarge an overlapping area between said two electrodes without any reduction of aperture ratio, thereby increasing a capacitance of the storage capacitor. Furthermore, the lower storage electrode overlaps with the supper storage electrode, that is, the pixel electrode with having only the gate insulating film therebetween, thereby more increasing a capacitance of the storage capacitor owing to a distance reduction between said two electrodes.

Particularly, according to the present invention, the gate pattern having a double-layer structure and the lower storage electrode 122 having a single-layer structure are formed with the aid of the half-tone mask. Further, the pixel hole 170 and the second contact hole 138 passing through the passivation film 150 and the first contact hole 130 passing through the passivation film 150 and the gate insulating film 144 are formed with the aid of another half-tone mask. Furthermore, the transparent conductive film is patterned by the lift-off process of the photo-resist pattern used upon patterning of the passivation film 150 to provide the transparent conductive pattern. As a result, it becomes possible to simplify a process by the three-round mask process.

In addition, according to the present invention, the first and second conductive layers of the gate pattern has a constant step coverage in a stepwise shape by the half-tone mask process, so that it becomes possible to prevent a breakage of the source/drain pattern caused by a steep inclination of the first and second conductive layers.

Moreover, according to the present invention, the half-tone mask is used when it is intended to relatively thinly define the wide photo-resist pattern, whereas the diffractive exposure mask is used when it is intended to relatively thinly define the narrow photo-resist pattern. Thus, it becomes possible to improve the process efficiency.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display device, comprising:

forming a gate line and a gate electrode having a double-layer structure with a transparent conductive layer and a gate pattern including a lower storage electrode having the transparent conductive layer on a substrate using a first mask;

forming a gate insulating film covering the gate pattern, and forming a semiconductor layer, a source/drain layer and a data line on the gate insulating film using a second mask; and forming a passivation film having a pixel hole and forming a pixel electrode connected to the drain electrode and overlapping with the lower storage electrode on the gate insulating film within the pixel hole using a third mask, wherein the pixel electrode is directly formed on the gate insulating film.

2. The method as claimed in claim 1, wherein the first mask includes a first half-tone mask.

3. The method as claimed in claim 1, wherein the second mask includes a diffractive exposure mask.

4. The method as claimed in claim 2, wherein the third mask includes a second half-tone mask.

5. The method as claimed in claim 1, wherein the forming a gate line and a gate electrode includes:

forming a first conductive layer as the transparent conductive layer and a second conductive layer on the substrate;

forming first and second photo-resist patterns having a different thickness on the second conductive layer by a photolithography using the first mask;

forming the gate line, the gate electrode and the lower storage electrode by patterning the first and second conductive layers using an etching through the first and second photo-resist patterns;

removing the second conductive layer on the lower storage electrode by an etching using the first photo-resist pattern; and removing the first photo-resist pattern.

6. The method as claimed in claim 5, wherein the second conductive layer remains on the lower storage electrode using the etching.

7. The method as claimed in claim 5, further comprising thinning the first photo-resist pattern and removing the second photo-resist pattern using an ashing after forming the gate line, the gate electrode and the lower storage electrode.

8. The method as claimed in claim 1, wherein the data line overlaps with the semiconductor layer.

9. The method as claimed in claim 1, wherein the lower storage electrode is protruded from the first conductive layer of the gate line.

10. The method as claimed in claim 1, wherein the forming a gate line and a gate electrode further includes forming a lower gate pad electrode connected to the gate line; and wherein forming a passivation film further includes forming a contact hole passing through the passivation film and the gate insulating film by exposing the lower gate pad electrode and forming an upper gate pad electrode connected to the lower gate pad electrode within the contact hole.

11. The method as claimed in claim 10, wherein the lower gate pad electrode includes the double-layer.

12. The method as claimed in claim 10, wherein forming a gate insulating film further includes forming the lower data pad electrode connected to the data line, and forming a passivation film further includes forming a second contact hole passing through the passivation film and the upper data pad electrode connected to the lower data pad electrode within the second contact hole.

13. The method as claimed in claim 12, wherein forming a passivation film includes:

forming a passivation film on the source and drain electrodes;

forming first and second photo-resist patterns having a different thickness on the passivation film by a photolithography using the second mask;

forming the first contact hole by an etching using the first and second photo-resist patterns;

forming the pixel hole and the second contact hole by the etching using the first photo-resist pattern;

forming a transparent conductive layer on the first photo-resist pattern; and forming a transparent conductive pattern having the pixel electrode, the upper gate pad electrode and the upper data pad electrode by removing the first photo-resist pattern and the transparent conductive layer using a lift-off.

14. The method as claimed in claim 13, further comprising thinning the first photo-resist pattern by an ashing and removing the second photo-resist pattern after forming the first contact hole.

15. The method as claimed in claim 13, wherein the forming the pixel hole and the second contact hole includes forming an exposed portion of the drain electrode and the lower data pad electrode.

16. The method as claimed in claim 15, wherein the pixel electrode is substantially laterally connected to the drain electrode.

17. The method as claimed in claim 15, wherein the upper data pad electrode is substantially laterally connected to the lower data pad electrode.

18. The method as claimed in claim 15, wherein the forming the pixel hole and the second contact hole includes etching a semiconductor layer under the exposed portion of the drain electrode and the lower data pad electrode.

19. The method as claimed in claim 15, wherein the forming the pixel hole and the second contact hole includes over-etching the passivation film such that the edge of the first photo-resist pattern is more protruded than the edge of the passivation film.

20. The method as claimed in claim 1, wherein the first and second conductive layers have constant step coverage.

* * * * *